(12) United States Patent
Hemkumar et al.

(10) Patent No.: US 6,212,273 B1
(45) Date of Patent: Apr. 3, 2001

(54) FULL-DUPLEX SPEAKERPHONE CIRCUIT INCLUDING A CONTROL INTERFACE

(75) Inventors: Nariankadu D. Hemkumar; Brent W. Wilson, both of Austin, TX (US)

(73) Assignee: Crystal Semiconductor Corporation, Austin, TX (US)

( * ) Notice: Subject to any disclaimer, the term of this patent is extended or adjusted under 35 U.S.C. 154(b) by 0 days.

(21) Appl. No.: 09/045,735

(22) Filed: Mar. 20, 1998

(51) Int. Cl.$^7$ .............................. H04M 1/00; H04B 3/20
(52) U.S. Cl. .............................................. 379/410; 379/392
(58) Field of Search ...................... 379/387–392, 379/406–411, 420

(56) References Cited

U.S. PATENT DOCUMENTS 5,136,531   8/1992   McCaslin .
5,631,900   5/1997   McCaslin et al. .
5,668,794   9/1997   McCaslin et al. .

*Primary Examiner*—Wing F. Chan
(74) *Attorney, Agent, or Firm*—Ken J. Koestner; Peter T. Rutkowski

(57) ABSTRACT

A full-duplex communication device includes a transmit channel, a receive channel, and echo cancellers connected between the transmit channel and the receive channel. A plurality of control parameters and status indicators are defined for both channels. The plurality of control parameters are accessed via a writable interface for controlling operations of the communication device. Typically the control parameters are modified, enabled, and disabled based on an implemented control method and based on signal conditions, including noise, echo, tone, and other abnormal noise conditions. A writable access port enables a user to request tweaking, modification, enabling, and disabling of multiple features and controls. A readable/writable access port enables access to multiple status parameters that are indicative of the status of the communication device and channel operating conditions.

63 Claims, 19 Drawing Sheets

| # | b15 | b14 | b13 | b12 | b11 | b10 | b9 | b8 | b7 | b6 | b5 | b4 | b3-0 |
|---|---|---|---|---|---|---|---|---|---|---|---|---|---|
| 0 | Mic | HDD | GB | | | RVol | | HDly | TSD | ACC | | TSMde | 0000 |
| 1 | THDet | | Taps | | NseRmp | TVol | | | RSD | | | AuNECD | 0010 |
| 2 | RHDet | | RSThd | | TDbtS | | RDbtS | | HHold | TDSRmp | RDSRmp | IdlTx | 0100 |
| 3 | TSAtt | | PCSen | | NErle | | NFNse | | TSThd | | TSBias | TGain | 0110 |
| 4 | AErle | | AFNse | | APFD | NPFD | AECD | NECD | | | RGain | | 1000 |
| 5 | HwID | TD | | | NPCD | | | | | ASdt | | NSdt | 1010 |

MCR Control Register Mapping

Register 0

| b15 | b14 | b13 | b12 | b11 | b10 | b9 | b8 | b7 | b6 | b5 | b4 | b3 | b2 | b1 | b0 |
|---|---|---|---|---|---|---|---|---|---|---|---|---|---|---|---|
| Mic | HDD | GB | | RVol | | | | TSD | ACC | | TSMde | | | | |
| 1 | 0 | 10 | | 0100 | | | | 0 | 00 | | 0 | 0 | 0 | 0 | 0 |
| A | | | | 4 | | | | | | | 0 | | | | |

| Bits | Name | Function | Word | Operation |
|---|---|---|---|---|
| 15 | Mic | Microphone preamplifier enable | 0<br>1* | disable mic preamp<br>enable mic preamp |
| 14 | HDD | Half-Duplex Disable | 0*<br>1 | enable half duplex<br>disable half duplex |
| 13-12 | GB | Graded Beta | 00<br>01<br>10*<br>11 | 0.00 dB/ms<br>0.75 dB/ms<br>0.38 dB/ms<br>0.19 dB/ms |
| 11-8 | RVol | Rx Volume control | 0000<br>0001<br>---<br>0100*<br>---<br>1010<br>1011<br>---<br>1101<br>1110<br>1111 | +30 dB<br>+27 dB<br><br>+18dB<br><br>+0 dB<br>-3 dB<br><br>-9 dB<br>-12 dB<br>mute |
| 7 | TSD | Tx Suppression Disable | 0*<br>1 | enable Tx suppression<br>disable Tx suppression |
| 6-5 | ACC | AEC Coefficient Control | 00*<br>01<br>10<br>11 | Normal<br>Clear<br>Freeze<br>*reserved* |
| 4 | TSMde | Tx Suppression Mode | 0*<br>1 | enable noise guard<br>disable noise guard |

Register 0 Bit Definitions

\* Denotes reset value

FIG. 10B

Register 1

| b15 | b14 | b13 | b12 | b11 | b10 | b9 | b8 | b7 | b6 | b5 | b4 | b3 | b2 | b1 | b0 |
|---|---|---|---|---|---|---|---|---|---|---|---|---|---|---|---|
| THDet | | Taps | | TVol | | | | RSD | NCC | | AuNECD | | | | |
| 0 0 | | 1 0 | | 1 0 1 0 | | | | 0 | 0 0 | | 0 | 0 | 0 | 1 | 0 |
| 2 | | 2 | | A | | | | 0 | 0 | | | 2 | | | |

| Bits | Name | Function | Word | Operation |
|---|---|---|---|---|
| 15-14 | THDet | Tx Half-duplex Detection threshold | 00* <br> 01 <br> 10 <br> 11 | 6 dB <br> 9 dB <br> 12 dB <br> reserved |
| 13-12 | Taps | AEC/NEC tap allocation | 00 <br> 01 <br> 10* <br> 11 | 444/64 (55.5 ms/8 ms) <br> 380/128 (47.5 ms/16 ms) <br> 316/192 (39.5 ms/24 ms) <br> 252/256 (31.5 ms/32 ms) |
| 11-8 | TVol | Tx Volume control | 0000 <br> 0001 <br> --- <br> 0100 <br> --- <br> 1010* <br> 1011 <br> --- <br> 1101 <br> 1110 <br> 1111 | +30 dB <br> +27 dB <br> <br> +18dB <br> <br> +0 dB <br> -3 dB <br> <br> -9 dB <br> -12 dB <br> mute |
| 7 | RSD | Rx Suppression Disable | 0* <br> 1 | enable Rx suppression <br> disable Rx suppression |
| 6-5 | NCC | NEC Coefficient Control | 00* <br> 01 <br> 10 <br> 11 | Normal <br> Clear <br> Freeze <br> reserved |
| 4 | AuNECD | Auto re-engage NEC Disable | 0* <br> 1 | enable Auto NEC <br> disable Auto NEC |

Register 1 Bit Definitions

\* Denotes reset value

FIG. 10C

Register 2

| b15 | b14 | b13 | b12 | b11 | b10 | b9 | b8 | b7 | b6 | b5 | b4 | b3 | b2 | b1 | b0 |
|---|---|---|---|---|---|---|---|---|---|---|---|---|---|---|---|
| RHDet | | RSThd | | NseRmp | | HDly | | HHold | TDSRmp | RDSRmp | IdlTx | | | | |
| 00 | | 00 | | 00 | | 00 | | 0 | 0 | 0 | 0 | 0 | 1 | 0 | 0 |
| 0 | | 0 | | 0 | | 0 | | | | 0 | | | 4 | | |

| Bits | Name | Function | Word | Operation |
|---|---|---|---|---|
| 15-14 | RHDet | Rx Half-duplex Detection threshold | 00* | 6 dB |
| | | | 01 | 9 dB |
| | | | 10 | 12 dB |
| | | | 11 | reserved |
| 13-12 | RSThd | Rx Suppression Threshold | 00* | 6 dB |
| | | | 01 | 9 dB |
| | | | 10 | 12 dB |
| | | | 11 | reserved |
| 11-10 | NseRmp | Noise estimator Ramp rate | 00* | 3 dB/s |
| | | | 01 | 6 dB/s |
| | | | 10 | 12 dB/s |
| | | | 11 | reserved |
| 9-8 | HDly | half-duplex Holdover Delay | 00* | 200 ms |
| | | | 01 | 100 ms |
| | | | 10 | 150 ms |
| | | | 11 | reserved |
| 7 | HHold | Hold in half-duplex on Howl | 0* | disable HHold |
| | | | 1 | enable HHold |
| 6 | TDSRmp | Tx Double-talk Suppression Ramp rate | 0* | slow |
| | | | 1 | normal |
| 5 | RDSRmp | Rx Double-talk Suppression Ramp rate | 0* | slow |
| | | | 1 | normal |
| 4 | IdlTx | half-duplex Idle return-to-Transmit | 0* | disable IdlTx |
| | | | 1 | enable IdlTx |

Register 2 Bit Definitions

* Denotes reset value

FIG. 10D

Register 3

| b15 | b14 | b13 | b12 | b11 | b10 | b9 | b8 | b7 | b6 | b5 | b4 | b3 | b2 | b1 | b0 |
|---|---|---|---|---|---|---|---|---|---|---|---|---|---|---|---|
| TSAtt | | PCSen | TDbtS | | | RDbtS | | TSThd | | TSBias | | | | | |
| 0 | 0 | 0 | 0 | 0 | 0 | 0 | 0 | 0 | 0 | 0 | 0 | 0 | 1 | 1 | 0 |
| | | | | | | | | | | | | | 6 | | |

| Bits | Name | Function | Word | Operation |
|---|---|---|---|---|
| 15-14 | TSAtt | Tx Suppression Attenuation | 00*<br>01<br>10<br>11 | 18 dB<br>12 dB<br>24 dB<br>reserved |
| 13 | PCSen | Path Change Sensitivity | 0*<br>1 | high sensitivity<br>low sensitivity |
| 12-10 | TDbtS | Transmit Double-talk Suppression attenuation "Tx Ducking" | 000*<br>001<br>010<br>---<br>110<br>111 | 0 dB<br>3 dB<br>6 dB<br>---<br>18 dB<br>21 dB |
| 9-8 | RDbtS | Receive Double-talk Suppression attenuation "Rx Ducking" | 00*<br>01<br>10<br>11 | 0 dB<br>3 dB<br>6 dB<br>9 dB |
| 7-6 | TSThd | Tx Suppression Threshold | 00*<br>01<br>10<br>11 | 15 dB<br>12 dB<br>9 dB<br>18 dB |
| 5-4 | TSBias | Tx Suppression Bias | 00*<br>01<br>10<br>11 | 18 dB<br>15 dB<br>21 dB<br>reserved |

Register 3 Bit Definitions

\* Denotes reset value

FIG. 10E

Register 4

| b15 | b14 | b13 | b12 | b11 | b10 | b9 | b8 | b7 | b6 | b5 | b4 | b3 | b2 | b1 | b0 |
|---|---|---|---|---|---|---|---|---|---|---|---|---|---|---|---|
| AErle | | AFNse | | NErle | | NFNse | | RGain | | TGain | | | | | |
| 00 | | 00 | | 00 | | 00 | | 00 | | 00 | | 1 | 0 | 0 | 0 |
| 0 | | 0 | | 0 | | 0 | | 0 | | 0 | | | 8 | | |

| Bits | Name | Function | Word | Operation |
|---|---|---|---|---|
| 15-14 | AErle | AEC Erle threshold | 00*<br>01<br>10<br>11 | 24 dB<br>18 dB<br>30 dB<br>reserved |
| 13-12 | AFNse | AEC Full-duplex Noise threshold | 00*<br>01<br>10<br>11 | zero<br>-42 dB<br>-54 dB<br>reserved |
| 11-10 | NErle | NEC Erle threshold | 00*<br>01<br>10<br>11 | 24 dB<br>18 dB<br>30 dB<br>reserved |
| 9-8 | NFNse | NEC Full-duplex Noise threshold | 00*<br>01<br>10<br>11 | zero<br>-42 dB<br>-54 dB<br>reserved |
| 7-6 | RGain | Rx analog Gain | 00*<br>01<br>10<br>11 | 0 dB<br>6 dB<br>9.5 dB<br>12 dB |
| 5-4 | TGain | Tx analog Gain | 00*<br>01<br>10<br>11 | 0 dB<br>6 dB<br>9.5 dB<br>12 dB |

Register 4 Bit Definitions

\* Denotes reset value

FIG. 10F

Register 5

| b15 | b14 | b13 | b12 | b11 | b10 | b9 | b8 | b7 | b6 | b5 | b4 | b3 | b2 | b1 | b0 |
|---|---|---|---|---|---|---|---|---|---|---|---|---|---|---|---|
| HwID | TD | APCD | NPCD | APFD | NPFD | AECD | NECD | ASdt | | NSdt | | | | | |
| 0 | 0 | 0 | 0 | 0 | 0 | 0 | 0 | 0 | 0 | 0 | 0 | 0 | 0 | 0 | 0 |
| | | | | | | | | | | | | | | | A |

| Bits | Name | Function | Word | Operation |
|---|---|---|---|---|
| 15 | HwID | Howl detector Disable | 0*<br>1 | enable howl detector<br>disable howl detector |
| 14 | TD | Tone detector Disable | 0*<br>1 | enable tone detector<br>disable tone detector |
| 13 | APCD | Acoustic Path Change detector Disable | 0*<br>1 | enable PC detector<br>disable PC detector |
| 12 | NPCD | Network Path Change detector Disable | 0*<br>1 | enable PC detector<br>disable PC detector |
| 11 | APFD | Acoustic Pre-emphasis Filter Disable | 0*<br>1 | enable filter<br>disable filter |
| 10 | NPFD | Network Pre-emphasis Filter Disable | 0*<br>1 | enable filter<br>disable filter |
| 9 | AECD | Acoustic Echo Canceller Disable | 0*<br>1 | enable AEC<br>disable AEC |
| 8 | NECD | Network Echo Canceller Disable | 0*<br>1 | enable NEC<br>disable NEC |
| 7-6 | ASdt | Acoustic Sidetone level | 00*<br>01<br>10<br>11 | none<br>-24 dB<br>-18 dB<br>-12 dB |
| 5-4 | NSdt | Network Sidetone level | 00*<br>01<br>10<br>11 | none<br>-24 dB<br>-18 dB<br>-12 dB |

Register 5 Bit Definitions

* Denotes reset value

FIG. 10G

FULL-DUPLEX SPEAKERPHONE CIRCUIT INCLUDING A CONTROL INTERFACE

BACKGROUND OF THE INVENTION

1. Field of the Invention

The present invention relates generally to telecommunication circuits. More specifically, the present invention relates to full-duplex speakerphone control circuits including a control interface.

2. Description of the Related Art

Most modem speakerphones use half-duplex operation which switches transmission between the far-end talker and the near-end speakerphone user. System designers resort to half-duplex operation because the acoustic coupling between the speaker and microphone is much higher in speakerphones than in a handset where the coupling is mechanically suppressed.

Hands-free communication through a microphone and speaker typically results in acoustic feedback or howling because the loop gain of the system exceeds unity when audio amplitudes are adjusted to a reasonable level.

Howling is a condition occurring in fall-duplex operation in which both the microphone and speaker are active at the same time so that, in conjunction with the reflection off the hybrid, a closed loop is created. The signal coupling between the speaker and the microphone causes feedback oscillation or howling when the coupling between the speaker and microphone is strong enough to increase the system closed loop gain above unity.

The solution to the howling problem has typically been half-duplex operation, in which either the transmit channel or the receive channel is active with both channels never active at the same time. Half-duplex operation prevents howling but diminishes the overall communication quality by clipping words and forcing the speaker at each end to wait for the speaker at the other end to stop talking.

In full-duplex conversation, both transmit and receive channels are active simultaneously. Telephone handsets allow full-duplex conversation quality.

A full-duplex communication device, such as a full-duplex speakerphone, includes highly complex and sophisticated control logic that classifies signals into categories including speech, noise, and tones. The fidelity of these classifications determines the performance of the communication device in echo cancellation, noise reduction, and handling of full-duplex communication when multiple parties are speaking. The level of coordination of a large number of mutually interacting control parameters in multiple communication channels that are continually modified, enabled, and disabled determines the stability of the control system, the appropriateness of handling of various conditions including high noise conditions, and communication fidelity.

Typically, the control task of a full-duplex communication system is hindered because various parameters are not available for updating. Some parameters are difficult to access. Often controls for multiple channels are not coordinated so that updating of parameters in one channel destabilizes operations in a different channel.

SUMMARY OF THE INVENTION

In accordance with the present invention, a full-duplex communication circuit including a control interface is provided for full-duplex, hands-free communication. The communication circuit includes a signal path, a half-duplex controller coupled to the signal path, a writable access port, and a controller interface coupled to the access port and coupled to the half-duplex controller. The controller interface includes a writable register having a half-duplex mode enable/disable field. The half-duplex mode enable/disable field controls the half-duplex controller to enable and disable half-duplex mode operation.

In accordance with another aspect of the present invention, a full-duplex communication circuit includes a receive signal path with a receive half-duplex controller coupled to the receive signal path, and a transmit signal path with a transmit half-duplex controller coupled to the transmit signal path. The circuit also includes an echo canceller with an adaptive filter coupled to the transmit signal path and coupled to the receive signal path for accessing a first signal, determining a compensation signal from the first signal, and compensating a second signal using the compensating signal to form a compensated second signal having a loop gain reduction. A controller interface is coupled to a writable access port and to the half-duplex controller. The controller interface includes a writable register having a field for controlling operation of the adaptive filter.

In accordance with still another aspect of the present invention, a full-duplex communication circuit includes a signal path, a suppressor coupled to the signal path, a writable access port, and a controller interface coupled to the access port and the suppressor. The controller interface includes a writable register having suppressor threshold field. The suppressor threshold field controls the suppressor to set a speech detection threshold for disengaging suppression.

BRIEF DESCRIPTION OF THE DRAWINGS

The present invention may be better understood, and its numerous objects, features, and advantages made apparent to those skilled in the art by referencing the accompanying drawings.

FIG. 9 is a schematic block diagram showing an embodiment of a tone detector that is used in the full-duplex speakerphone integrated circuit.

FIGS. 10A–10G are tables that illustrate six control registers that are accessed via the Microcontroller Control Register (MCR).

The use of the same reference symbols in different drawings indicates similar or identical items.

DESCRIPTION OF THE PREFERRED EMBODIMENTS

Figure 1:
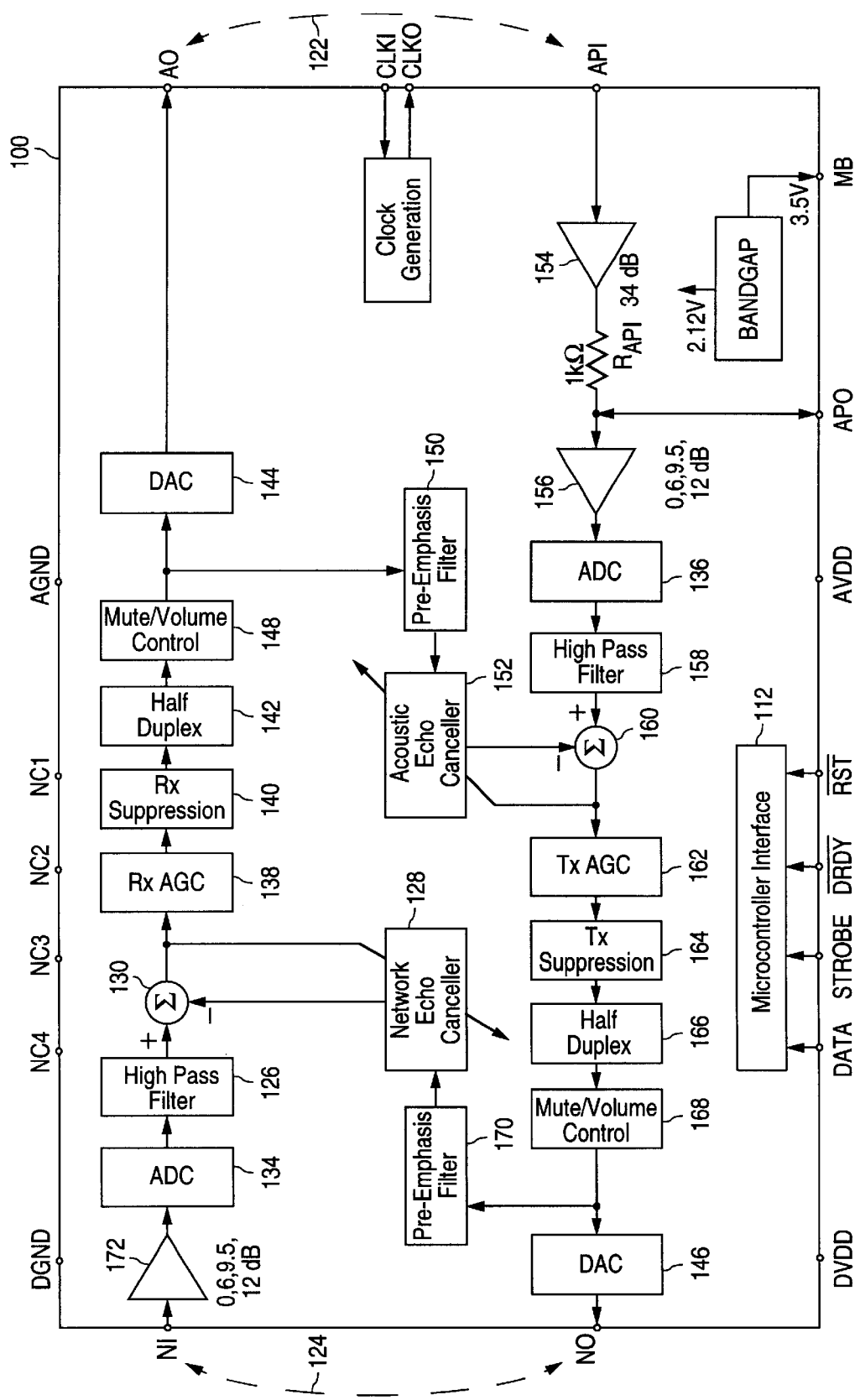
FIG. 1 is a schematic block diagram illustrating an embodiment of a full-duplex speakerphone integrated circuit.

Referring to FIG. 1, the full-duplex speakerphone integrated circuit 100 is a complete system implementation of a digital signal processor (DSP) 114 with RAM 116 and program ROM 118. The DSP 114 executes acoustic processing routines such as adaptive filtering, half-duplex switching, digital volume control, echo cancellation including Acoustic Echo Cancellation (AEC) and Network Echo Cancellation (NEC), and supplementary echo suppression algorithms operating on data transferred using two delta-sigma codecs 106 and 108. The full-duplex speakerphone integrated circuit 100, is intended for use in hands-free, telephony quality audio communication applications including speakerphones, inexpensive video-conferencing, and cellular phone car kits. The full-duplex speakerphone integrated circuit 100 utilizes few external components and is controlled using a microcontroller interface 112 which supplies access to various control functionality.

The full-duplex speakerphone integrated circuit 100 includes a telephone interface 102, an audio interface 104, two codecs 106 and 108, and a digital signal processor (DSP) 114 that performs echo canceling.

The full-duplex speakerphone integrated circuit 100 includes an analog interface 120 for connection to transmit and receive signal paths. The analog interface 120 also carries information about the echo path to the adaptive filter. An echo is defined as a signal that returns to the signal source after some delay. A network echo is an echo that results from a reflection due to an impedance mismatch in a 2-to-4 wire converter (hybrid). An acoustic echo is an echo created by signal propagation in a room from a speaker to a microphone. A reverberation is local information that bounces around the room before reaching the microphone.

In a speakerphone application, one input terminal API (Acoustic Interface Preamplifier Input) of the full-duplex speakerphone integrated circuit 100 is connected to receive a signal from a microphone (not shown). In embodiments in which an analog pre-amplifier 154 is not used, the microphone may be connected to an APO terminal, directly to an acoustic interface programmable analog gain stage amplifier 156, bypassing the analog pre-amplifier 154. The microphone input terminal API is typically called a "near-end" or transmit input connection. The Near-End is the location of the acoustic interface including a speaker and a microphone. The analog interface 120 also includes an output terminal AO (Acoustic Interface Output) that connects to send a signal to a speaker (not shown). The output terminal AO that leads to the speaker is sometimes called a "near-end" or receive output connection. The input terminal API and output terminal AO, in combination, that connect respectively to the microphone and speaker form an acoustic interface 122.

The signal received at the near-end input terminal API is passed to a "far-end" or transmit output terminal NO (Network Interface Output) after acoustic echo cancellation. The Far-End is the location connected to the network interface. The signal at the output terminal NO is sent to a telephone line (not shown). The signal from the telephone line is received at the far-end input terminal NI (Network Interface Input), which is also called the receive input, and the telephone input signal is passed to the receive output terminal AO after network echo cancellation. In combination, the far-end input terminal NI and the far-end output terminal NO form a network interface 124.

The network interface 124 and the acoustic interface 122 form the analog interface 120. Both the network interface 124 and the acoustic interface 122 are implemented using delta sigma converters (not shown) running at an output word rate of 8 kHz, resulting in a passband from DC to 4 kHz.

Input paths of both the network interface 124 and the acoustic interface 122 include analog to digital converters (ADCs) 134 and 136 respectively. The ADCs 134 and 136, to achieve antialiasing and full-scale input voltage, expect a single-pole RC filter with a corner at 8 kHz, and are post-compensated internally to prevent resultant passband droop. The ADCs also expect a maximum of 1 $V_{rms}$ (2.8 $V_{pp}$) at the input terminals, which are biased around 2.12 VDC. A signal of higher amplitude clips the ADC input and may result in poor echo cancellation leading to loss of full-duplex performance.

Output paths of both the network interface 124 and the acoustic interface 122 include delta-sigma digital to analog converters (DACs) 144 and 146, respectively and have specifications similar to the ADC specifications. The DACs 144 and 146 are pre-compensated to expect a single-pole RC filter with a corner frequency at 4 kHz. The full scale voltage output from a DAC is 1 $V_{rms}$ (2.8 $V_{pp}$) swinging around a DC bias of 2.12 V.

A signal path from the network interface 124 far-end input terminal NI to the acoustic interface 122 near-end output terminal AO (Acoustic Interface Output) includes a network interface programmable analog gain stage amplifier 172, the network input ADC 134 and a network input high pass filter 126. The network interface programmable analog gain stage amplifier 172 is accessed via the microcontroller interface 112 and amplifies signals received at the far-end input terminal NI. In an illustrative embodiment, the network interface programmable analog gain stage amplifier 172 supports gains of 0 dB, 6 dB, 9.5 dB, and 12 dB that are added to the network input signal prior to the network input ADC 134.

The signal generated by the network input high pass filter 126 is processed to determine a parameter, called the far-end input power fe_in_pow, that is used in suppression. A NEC summing node 130 subtracts an estimate of the network echo generated by a network echo canceller 128 from the filtered network input signal at the output terminal of the network input high pass filter 126. The signal generated by the NEC summing node 130 is processed to determine a parameter, called the network error power estimate nc_error_pow, that is used in suppression.

The far-end input power fe_in_pow is the power estimate of the far-end input signal prior to the NEC summing node 130. The network error power estimate nc_error_pow is the power estimate of the signal produced by the NEC summing node 130.

The difference signal produced by the NEC summing node 130 is fed back to the network echo canceller 128 to control the operation of the network echo canceller (NEC) 128. The difference signal has gain adjusted using a receiver automatic gain control (AGC) 138 and echoes suppressed using a receive suppressor 140. The full-duplex speakerphone integrated circuit 100 implements a peak-limiting Automatic Gain Control (AGC) to allow a greater dynamic range without clipping the signal. The network input signal from the receive suppressor 140 is applied to a network input half-duplex controller 142 and conditioned using a network input mute and volume controller 148. The conditioned network input signal is applied to an acoustic signal pre-emphasis filter 150 and to the acoustic output signal DAC 144. The acoustic signal pre-emphasis filter 150 filters the conditioned network input signal for application to an acoustic echo canceller 152. The acoustic output signal DAC 144 converts the conditioned network input signal to analog form and supplies the resulting analog signal to the near-end output terminal AO.

A signal path from the acoustic interface 122 near-end input terminal API to he network interface 124 far-end output terminal NO includes an analog pre-amplifier 54, an acoustic input path resistor $R_{API}$, and an acoustic interface programmable analog gain stage amplifier 156. An analog preamplifier output APO terminal and an analog preamplifier input API terminal are, respectively, the input and output terminals of the built-in analog pre-amplifier 154. In the illustrative embodiment, the analog pre-amplifier 154 is an inverting amplifier with a fixed gain of 34 dB biased around an input offset voltage ($V_{off}$) of 2.12 V. The analog preamplifier output APO is the output signal of the analog pre-amplifier 154 passed through the acoustic input path resistor RAP, for example a 1 kQ resistor. Following the analog pre-amplifier 154 in the acoustic input signal pathway is the acoustic interface programmable analog gain stage amplifier 156 which is controlled via the microcontroller interface 112. In an illustrative embodiment, the acoustic interface programmable analog gain stage amplifier 156 supports gain levels of 0 dB, 6 dB, 9.5 dB, and 12 dB that are added to the acoustic input signal prior to the acoustic input ADC 136.

The amplified acoustic input signal is input to the acoustic input ADC 136, then digitally filtered using the acoustic input high pass filter 158. The signal generated by the acoustic input high pass filter 158 is processed to determine a parameter, called the near-end input power ne_in_pow, that is used in suppression. An AEC summing node 160 subtracts an echo canceller signal generated by an acoustic echo canceller (AEC) 152 from the filtered acoustic input signal at the output terminal of the acoustic input high pass filter 158. The difference signal generated by the AEC summing node 160 is processed to determine a parameter, called the acoustic error power estimate ec_error_pow, that is used in suppression.

The near-end input power ne_in_pow is the power estimate of the near-end input signal prior to the AEC summing node 160. The acoustic power estimate ec_error_pow is the power estimate of the signal produced by the AEC summing node 160.

The various power estimates such as fe_in_pow, ne_in_pow, nc_error_pow, and ec_error_pow are determined from peak-detecting power estimators (not shown) which employ a single-pole infinite impulse response (IIR) filter. In the illustrative embodiment, the power estimator is a "leaky" peak estimating power estimator that is defined by equation as follows:

$$P(k)=\alpha P(k-1)+(1-\alpha)(x(k))^2, \quad (1)$$

if $$[x(k)]^2 > P(k), \text{ then } P(k)=[x(k)]^2, \quad (2)$$

where equation (1) is a filter and equation (2) is a peak detector, x(k) is the signal, P is the power estimate, k is a time sample index, and a is an IIR filter pole constant. The various power estimates are calculated using different signals x(k), depending upon whether the signal x(k) is produced at the far-end or the near-end, and whether the signal x(k) is acquired prior or subsequent to a summing node. Although this example employs a single-pole UIR filter, other suitable filters that are known in the signal processing arts may be utilized, including multiple-pole IIR filters and various types of finite impulse response (FIR) filters.

The difference signal produced by the AEC summing node 160 is fed back to the acoustic echo canceller 152 to control the operation of the acoustic echo canceller 152. The difference signal has gain adjusted using a transmitter automatic gain control (AGC) 162 and has echoes suppressed using a transmit suppressor 164. The acoustic input signal from the transmit suppressor 164 is applied to an acoustic input half-duplex controller 166 and conditioned using an acoustic input mute and volume controller 168. The conditioned acoustic input signal is applied to a network signal pre-emphasis filter 170 and to the network output signal DAC 146. The network signal pre-emphasis filter 170 filters the conditioned acoustic input signal for application to the network echo canceller 128. The network output signal DAC 146 converts the conditioned acoustic input signal to analog form and supplies the resulting analog signal to the far-end network output terminal NO.

Figure 2:
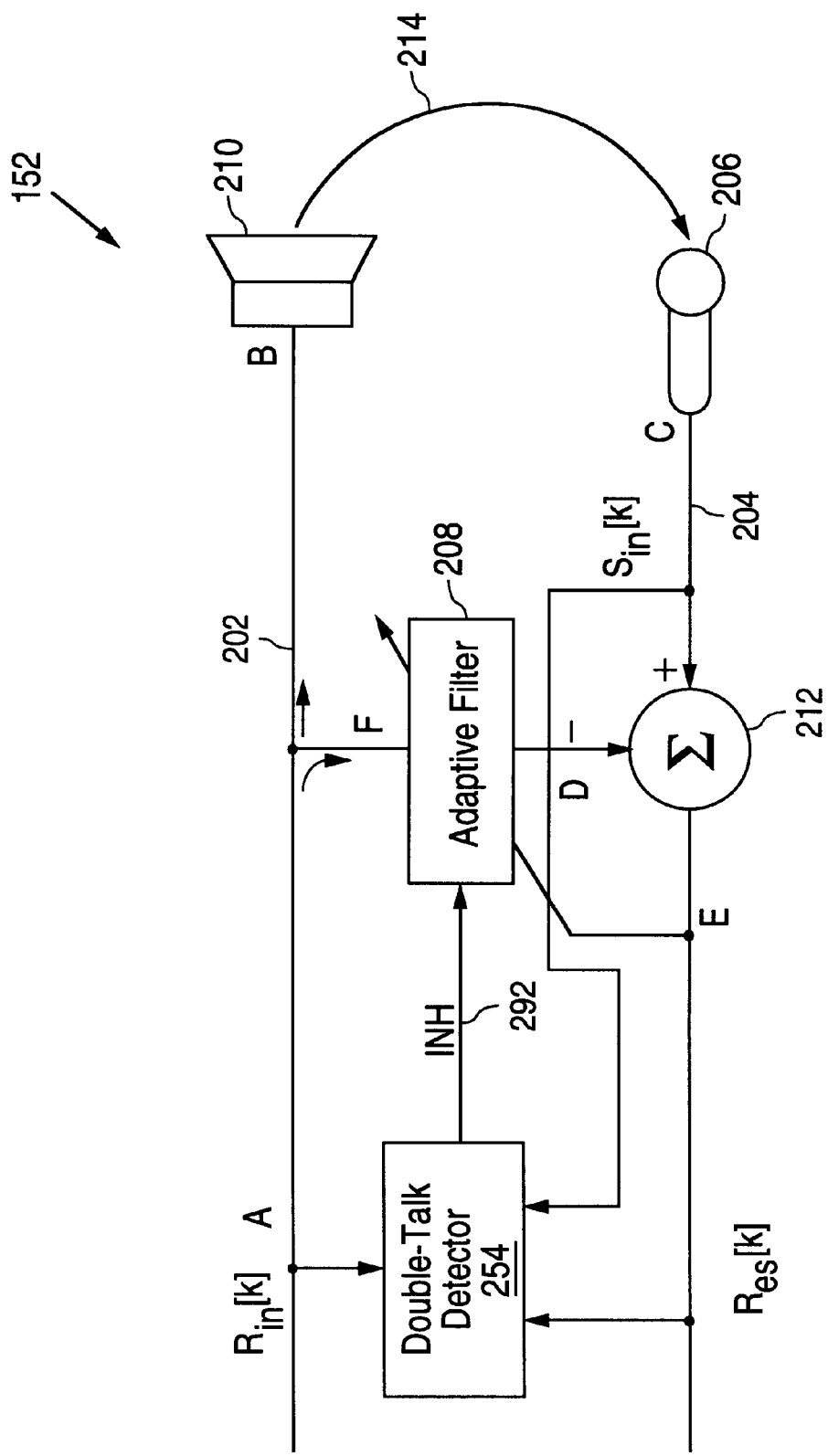
FIG. 2 is a simplified block diagram illustrating an acoustic echo canceller in the full-duplex speakerphone.

Referring to FIG. 2, a simplified block diagram illustrating an acoustic echo canceller 152 is used to describe the theory of operation of the full-duplex speakerphone integrated circuit 100. A complementary operation is performed by the NEC 128 on the network echo. A receive path 202 passes network signals from the far-end input terminal NI to a speaker 210. A Receive Path is the signal path from the Far-End input to the Near-End output. A transmit path 204 carries signals detected by a microphone 206 to the far-end output terminal NO. A transmit path is the signal path from the Near-End input to the Far-End output. Far-end signals from the far-end input terminal NI are filtered using an adaptive filter 208 and subtracted from the near-end signals at an acoustic summing node 212. The adaptive filter 208 supplies the echo canceling operation of the acoustic echo canceller (AEC) 152 and the network echo canceller (NEC) 128.

The adaptive filter 208 is a digital FIR filter that adjusts the FIR filter coefficients to match a transfer function, such as the echo path 214 between the speaker 210 and microphone 206. Finite impulse response filters (FIRs) are well-known in the signal processing art. Any suitable FIR filter may be employed in the adaptive filter 208. The adaptive filter 208 compensates for different and changing conditions, such as someone moving in the room.

The acoustic echo path 214 describes the acoustic coupling between the speaker 210 and the microphone 206. The acoustic echo path 214 describes both the magnitude and delay characteristics of an echoed signal and is affected by the speaker 210, the microphone 206, phone housing, room, objects in the room, movement, and the talker. The network echo path is comprised of the transfer function between NO and NI.

Full-Duplex is a state in which both Transmit and Receive paths are simultaneously active. Half-Duplex is a state when either the transmit path or the receive path is active, but both paths are not active.

The adaptive filter 208 performs adaptive filtering to achieve fill-duplex hands-free communication. The adaptive filter 208 dynamically models an acoustic path 214, which is also called an echo path, between the speaker 210 and the microphone 206 including the acoustic coupling of the path. Acoustic Coupling refers to the strength of the output signal from the speaker 210 that is received at the input terminal of the microphone 206. The adaptive filter 208 executes adaptive filtering operations using suitable update control and speech/tone detection algorithms to prevent the filter from mistraining.

The adaptive filter 208 is used to cancel echoes and reduce loop gain. The receive path 202 carries a signal, called a training signal, to the speaker 210 and to the input terminal of the adaptive filter 208. The training signal at the speaker 210 is transmitted on the acoustic path 214 but modified by transducers and the acoustic environment to form an echo signal that is carried to a positive input terminal of the acoustic summing node 212 via the microphone 206.

If the adaptive filter 208 is fully trained to the acoustic path 214 so that the adaptive filter 208 has a transfer function that closely matches the acoustic path 214, the filtered signal generated by the adaptive filter 208 and supplied to a negative input terminal of the acoustic summing node 212 is approximately equal to the echo signal applied to the positive input terminal of the acoustic summing node 212. The acoustic summing node 212 subtracts the filtered correction signal from the echo signal, yielding a small error signal at an output terminal of the acoustic summing node 212. The network interface includes a similar network summing node that subtracts a filtered correction signal from the receive signal.

A person at the near-end speaking into the microphone 206 generates a speech signal that is detected by the microphone 206, carried to the acoustic summing node 212, and passed through the acoustic summing node 212 unchanged because the adaptive filter 208 has no training signal comparable to the speech signal to cancel. In this manner, a speech signal can arrive at the far-end input terminal NI at the same time as a speech signal is present at the microphone 206 and the person speaking at the far-end can hear the person at the near-end without the person at the far-end hearing the person's own echo.

However, in actual operation, the acoustic path 214 is not static. Acoustic signals on the acoustic path 214 change when people move in a room, the speaker or the microphone are moved, when a piece of paper is dropped on the speaker, or multiple other occurrences. Therefore, the adaptive filter 208 is designed to adapt to modify the transfer function to match the transfer function of the environment.

The adaptive filter 208 adapts the transfer function by measuring the error signal at the output terminal of the acoustic summing node 212, and adjusting the transfer function of the adaptive filter 208 as a function of the error signal to minimize the error signal. The error signal is fed back to the adaptive filter 208 to measure performance of the echo canceller and determine a suitable adaptation or training response to the error signal. The difficulty with the training response is that a person speaking into the microphone 206 generates a speech signal that passes through the acoustic summing node 212 to generate a non-zero error signal even though speech has occurred, not an error, so the transfer function of the adaptive filter 208 should not change.

If the adaptive filter 208 attempts to change the transfer function to adapt to the near-end speech signal, the adaptive filter 208 has no way to reduce the error signal since the receive path 202 is not carrying an input training signal to the adaptive filter 208. The adaptive filter 208 does not generate an appropriate output signal and the adaptive filter 208 mistrains. To prevent mistraining, the acoustic echo canceller 152 uses a double-talk detector 254 to determine when to update the transfer function. Double-talk is a condition that occurs when both near-end and far-end speakers speak simultaneously. The double-talk update control algorithms predominantly determine the performance of the echo canceller.

Near-end noise interferes with estimation of the path response by the echo canceller for many reasons. First, near-end stationary noise sets an upper bound on the ERLE of an echo canceller for a given adaptive filter update gain, thereby limiting loop-gain reduction. For a high near-end noise level, the echo canceller fails to produce sufficient loop-gain reduction to prevent instability even though the uncancelled residual echo is still largely masked by the near-end noise as detected by a far-end listener. Thus, stationary noise disadvantageously limits the ERLE but does not cause the echo to rise to objectionable levels.

Second, non-stationary noise leads to leaking of perceptible echo to the far-end listener. For example, if background noise suddenly attenuates, clearly perceptible residual echo that was previously masked by the noise leaks to the far-end listener until the echo canceller reconverges to accommodate a new noise floor.

Third, near-end speech is a type of non-stationary "noise" that typically does not occur at the same time as far-end speech so that near-end speech does not reliably mask echo. If an echo canceller adapts while near-end speech is present, the ERLE is significantly degraded. Therefore, adaptive filter coefficient updating is blocked while near-end speech is present. The double-talk detector 254 performs the update blocking operation by sending an inhibit signal to the adaptive filter 208 via an inhibit line 292.

The double-talk detector 254 operates to control the time that coefficient updates are performed. The double-talk detector 254 receives as inputs the $R_{in}(k)$ signal on line 202, the $S_{in}(k)$ signal on transmit path line 204 prior to the acoustic summing node 212 and the $R_{es}(k)$ signal on transmit path line 204 subsequent to the acoustic summing node 212. The double-talk detector 254 reliably blocks updates when near-end speech is present. Erroneous updating of the adaptive filter while near-end speech or another non-stationary noise source is present seriously degrades canceller performance. The double-talk detector 254 also reliably permits adaptive filter updates when near-end speech is not present. Erroneous blocking of updates while near-end speech is not present unnecessarily limits performance and seriously degrades canceller performance.

Effective update control operations are highly useful in an echo canceller implementation to suitably determine when the adaptive filter 208 is to adapt, and to correct performance when the path changes too quickly for the adaptive filter 208. For example, if the adaptive filter 208 adds rather than cancels signal power, the update control operations reset the adaptive filter 208 to cleared coefficients, forcing the adaptive filter 208 to restart.

A path change is a change in the transfer function that describes the acoustic echo path 214. Changes in the acoustic echo path are most commonly due to motion in the room or gain changes at an external speaker. Network echo path is most easily changed by picking up an extension or hanging up the phone.

In a worst-case condition, speakers at both the far-end input terminal NI and the microphone 206 are simultaneously speaking and the speaker at the microphone 206 is moving. The double-talk detector interrupts updating of the transfer function, but the echo is not optimally reduced due to a change in the acoustic path 214.

In an illustrative embodiment, the adaptive filter 208 uses a "Normalized Least-Mean-Square (NLMS)" update algorithm to learn the echo path transfer function. The adaptive filter 208 is a Finite Impulse Response (FIR) filter with 508 taps and models up to 63.5 ms of total path response at a sampling rate of 8 kHz that is partitionable between the AEC 152 and the NEC 128. The coverage time of the adaptive filter 208 is determined by the formula:

$$\left(\frac{1}{8kHz}\right) \times 508 = 63.5ms.$$

Coverage Time relates to the time duration of a sample sequence from the acoustic echo path 214 and further relates to the size of a space that is suitably sampled. The full-duplex speakerphone integrated circuit 100 echo canceller has 508 taps and a coverage time of 63.5 ms. Sound travels through air at a rate of around 1 ft/ms. Thus the echo canceller is suitably used in a room with walls 32 feet away, discounting multiple reflections. At a 32 foot distance, most of the echo is attenuated due to the physical separation. The majority of the acoustic coupling comes from the first signal arrival, or directly from the speaker 210 to the microphone 206. The first signal is by far the strongest.

The adaptive filter 208, like all FIR filters, only models Linear and Time Invariant (LTI) systems. Any non-linearity or distortion in the echo path is therefore not modeled by the transfer function and signals resulting from the non-linearity are not canceled. Signal clipping and poor-quality speakers are common sources of non-linearity and distortion.

Volume control (not shown) is implemented in the receive path 202 only between the NEC summing node 130 and the acoustic output signal DAC 144/acoustic echo canceller 152 since a real-time external change in the gain of the speaker driver results in a change in the transfer function of the acoustic echo path and therefore forces the AEC adaptive filter to readapt. With the volume control positioned before the adaptive filter, the echo path does not change, and retraining is unnecessary.

Similarly, volume control (not shown) is implemented in the transmit path 204 only between the AEC summing node 160 and the network output signal DAC 146/network echo canceller 128 since a real-time external change in gain often results in a change in the transfer function of the network echo path and therefore forces the NEC adaptive filter to readapt.

In the full-duplex speakerphone integrated circuit 100 shown in FIG. 1, the analog pre-amplifier 154, the acoustic interface programmable analog gain stage amplifier 156, and the transmitter automatic gain control (AGC) 162 supply volume control in the transmit path, and the network interface programmable analog gain stage amplifier 172 and the receiver automatic gain control (AGC) 138 supply volume control in the receive path.

A common problem for an echo canceller is signal clipping in the echo path. For example, if a speaker driver is driven to a fullscale output signal, distortion in the speech may be hard to perceive by human hearing but is highly difficult to manage in the echo canceller. To avoid the effects of clipping at the DACs, gain in the receive and transmit signal paths is controlled using automatic gain control (AGC). The analog gain stages are selected for gain settings that do not result in clipping when a maximum signal is received at the input terminals of the analog interfaces.

Another problem in an echo canceller is poor speaker quality. A poor quality speaker that is acceptable for a half-duplex speakerphone may limit performance in a full-duplex system since speaker distortion is not modeled by the adaptive filter 208 and limits the effectiveness of the transfer function.

A typical training signal for the adaptive filter 208 is a speech signal. However, most adaptive filters work optimally with a white noise training signal. A speech signal has a quasi-periodic nature and very different spectral characteristics than white noise signal. Quasi-periodic signals cause the formation of spurious non-zero coefficients within the adaptive filter 208 at tap intervals determined by the periodicity of the signal. Thus, small changes in period are highly destructive to performance of the adaptive filter 208. The full-duplex speakerphone integrated circuit 100 uses the network signal pre-emphasis filter 170 and the acoustic signal pre-emphasis filter 150 to prevent filter corruption with speech by pre-emphasizing the signal sent to the adaptive filter to remove much of the low frequency content. The acoustic signal pre-emphasis filter 150 and network signal pre-emphasis filter 170 are advantageous for usage of a speech training signal. However, white noise training signals result in sub-optimal performance and are not suitable.

The update gain of an adaptive filter, sometimes called the "beta", is the change rate of filter coefficients. If beta is too low, the adaptive filter is slow to adapt. Conversely, if beta is too high, the adaptive filter is unstable and creates unwanted noise in the system. In typical echo canceller implementations, the beta is a fixed value for all the filter coefficients. However some implementations have predictable echo path response characteristics permitting adjustment of the beta for groups of coefficients to improve the adaptation rate while maintaining stability.

For example, acoustic echo tends to decay exponentially so initial taps in the adaptive filter 208 are large and the later taps are small. A large beta for the initial large taps allows the initial taps to adapt faster. A small beta for the subsequent taps maintains stability and suppresses the spurious non-zero coefficient taps resulting from quasi-periodic signals.

Speech Detection

The full-duplex speakerphone integrated circuit 100 detects speech by using power estimators to track deviations from a background noise power level. The power estimators filter and average the raw incoming samples from an analog-to-digital converter (ADC), or the input terminals to either the receiver AGC 138 or the transmitter AGC 162, which respectively correspond to the output terminals of the NEC and AEC summing nodes 130 and 160.

The background noise level is established by a register (not shown) that increases the level by +3 dB increments at intervals determined by a background noise power estimator ramp rate (NseRmp) that is set in Microcontroller Control Register (MCR) 2, bits 11-10. When the power estimator level rises, the background noise level slowly increases to attempt to match the power estimator level. When the power estimator level is below the background noise level, the background noise level is quickly reset to match the power estimator level. Usage of the power estimator level advantageously allows significant flexibility in tracking the background noise level.

A speech event is detected when a power estimator level rises above the background noise level by a defined threshold. A half-duplex receive speech detector threshold (RHDet) is set in MCR2, bits 15-14. A half-duplex transmit speech detector threshold (THDet) is set in MCR1, bits 15-14. A receive suppression speech detector threshold (RSThd) is set in MCR2, bits 13-12. The transmit speech detectors for both half-duplex and suppression default to 6 dB.

Constant power signals that persist for long durations, such as tones from a signal generator, are detected as speech events only as long as the background noise level is not elevated to within the speech detection threshold of the signal power. When a tone persists for a sufficient duration, the background noise level becomes equal to the power estimator level so the tone is no longer considered to be speech. The sufficient duration is based on the power difference between the signal and the ambient noise power, as well as NseRmp. The full-duplex speakerphone integrated circuit 100 has a tone detector to prevent updates when tones are present and allow tones to persist regardless of the speech detectors.

The Microcontroller Control Register (MCR) entries are discussed in more detail hereinafter.

A system including the full-duplex speakerphone integrated circuit 100 relies on the echo canceller for stability. In some conditions, the echo canceller does not perform adequately so that a fail-safe technique is employed to guarantee communication. Reverting to half-duplex operation is one technique for assuring communication. Control of half-duplex operation is performed by half-duplex controllers including the network input half-duplex controller 142 and the acoustic input half-duplex controller 166

When the full-duplex speakerphone integrated circuit 100 is first powered or emerges from a reset condition, echo canceller coefficients are cleared and the echo cancellers are effectively disabled, supplying no benefit. The half-duplex mode is activated to prevent howling and echoes from interfering with communication. Once the adaptive filters 128 and 152 of the full-duplex speakerphone integrated circuit 100 have adapted sufficiently, the half-duplex mode is automatically disabled, and full-duplex communication begins.

The half-duplex mode operates in three states including a transmit state, a receive state, and an idle state. In the transmit state, the transmit channel is open and the receive channel is muted. In the receive state, the transmit channel is muted. The idle state is an internal state that is used to enhance switching decision making. The full-duplex speakerphone integrated circuit 100 is placed in the idle state before allowing a state change between the transmit and receive states.

The half-duplex controller is susceptible to echo conditions. Therefore, a holdover timer is included in the full-duplex speakerphone integrated circuit 100 to assist prevention of false switching. The holdover timer forces the channel to remain in a current state for a fixed duration after speech terminates. HDly bits (9-8) of MCR2 sets the duration of the holdover. A longer holdover tends to make interrupting much harder, but is much more robust to spurious switching caused by echo.

The full-duplex speakerphone integrated circuit 100 implements a peak-limiting automatic gain control (AGC) in both the transmit path and the receive path to boost low-level signals without compromising performance when high amplitude signals are present. In this manner, AGC effectively performs dynamic range compression.

Automatic gain control (AGC) operates by setting a reference level based on a transmit volume TVol value (bits 11-8) in MCR 1 for the transmit path and based on a receive volume RVol value (bits 11-8) in MCRO for the receive path. If an input signal from either the near-end input terminal API or the far-end input terminal NI, respectively, is above the reference level, the input signal is attenuated to the reference level with a selected attack time, for example 125 $\mu$s. The attenuation level decays with a time constant of 30 ms unless another signal greater than the reference level is detected. After the attenuation, a post-scaler (not shown) scales the reference level to a full-scale level (the maximum digital code) to amplify all signals by the difference between the reference level and full-scale level.

Figure 3:
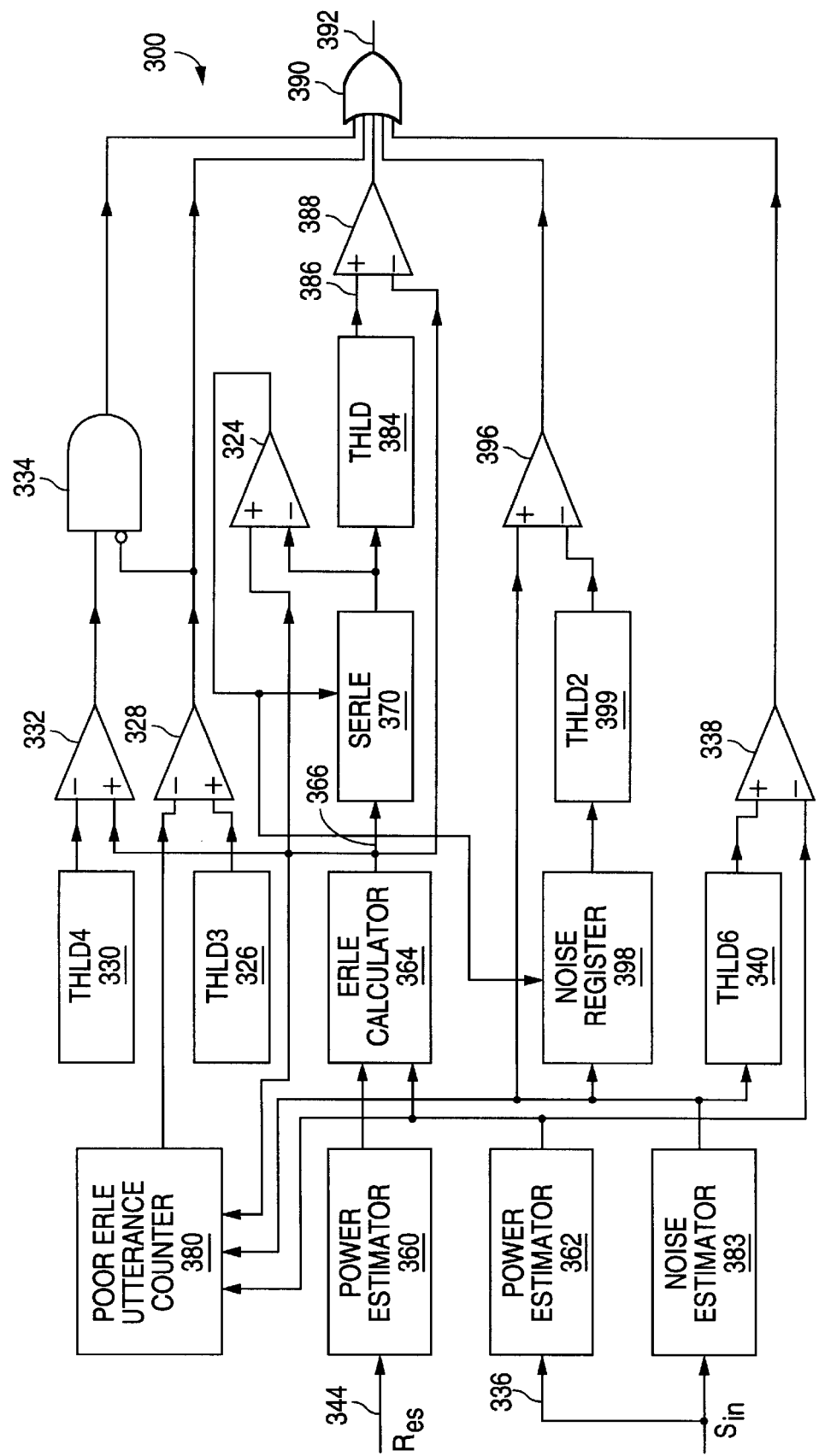
FIG. 3 is a detailed schematic block diagram of a double-talk detector in the full-duplex speakerphone.

Referring now to FIG. 3, a schematic block diagram illustrates an embodiment of a double-talk detector 300. A $R_{es}(k)$ signal from line 344 and the $S_{in}(k)$ signal from line 336 are connected to respective power estimation circuits 360 and 362. The power estimation circuits 360 and 362 are peak-detecting power estimators which utilize a single-pole infinite impulse response (IIR) filter defined by the previously defined equations (1) and (2).

For far-end input power, $R_{in}$ is substituted for the value of x and for near-end input power, $S_{in}$ is substituted for x. In the estimator, Equation (1) is a one-pole IIR filter, but is alternatively implemented as a multi-pole IIR filter, or as an FIR filter. Equation (2) is a peak detector. Instead of utilizing a squaring function on the input, both Equations (1) and (2) alternatively use an absolute value ($|x(k)|$) to reduce complexity.

The power estimators 360 and 362 generate power signals that are applied to an ERLE calculator 364. The ERLE calculator 364 calculates the ERLE and generates an output signal at a node 366. The output signal at the node 366 is applied directly to a negative input terminal of a comparator 368 and also to the input terminal of a register 370. The register 370 is a register for storing the best value for ERLE, the "SERLE", which in the present embodiment is the largest ERLE value. The output signal from the register 370 is connected to the positive input of the comparator 368. When the value generated by the ERLE calculator 364 is higher than the SERLE value in register 370, as determined by a comparator 324, an update is supplied and a new value is stored in the register 370 as the new SERLE. The updated SERLE in the register 370 connected to the input terminal of the comparator 368 via an ERLE threshold (THLD) block 384 that multiplies the SERLE value times a predetermined ERLE threshold (THLD) so that the ratio ERLE/SERLE is compared to an ERLE threshold (THLD). A suitable ERLE threshold (TELD) is 0.5.

The output signal of the SERLE register 370 is divided by a predetermined percentage THLD, which is represented by a block 384, to supply a fraction on an output line 386. The fraction of the SERLE on the line 386 is input to the positive input terminal of a comparator 388. The negative input terminal of the comparator 388 is connected to the output terminal of the ERLE calculator 364 such that the comparator 388 performs a comparison using a fraction of the SERLE as a threshold. The output signal from the comparator 388 is applied to one input terminal of an OR gate 390, which supplies an inhibit signal INH to an adaptive filter, such as the adaptive filter 208 shown in FIG. 2, on a line 392. Updates are blocked or inhibited whenever the current ERLE is less than the SERLE stored in register 370 by a predetermined fraction of the SERLE.

If the ERLE/SERLE ratio is greater than THLD, the ERLE indicates that the echo canceller performance is suitable in comparison to the SERLE best value and the comparator 388 does not generate an inhibit signal that is applied to an input terminal of an inhibiting OR-gate 390. Otherwise, the ERLE indicates that the echo canceller performance is not suitable so that an inhibit signal is generated that inhibits updating of the echo canceller filter coefficients in a first update blocking condition.

The $S_{in}(k)$ signal from line 336 is also applied to a noise estimation circuit 383 which estimates background noise from the $S_{in}(k)$ signal. The estimated background noise from the background noise estimator 383 is stored in a noise register 398 when the value generated by the ERLE calculator 364 is higher than the SERLE value in register 370, as determined by the comparator 324.

A second update blocking operation is controlled by a comparator 396 that has a positive input terminal connected to the output terminal of a near-end background noise estimator 383. The background noise is compared to a stored value in the noise register 398 received from the background noise estimator which is then offset to a higher level by an amplitude threshold (THLD2) in a test peak offset circuit 399. A suitable amplitude threshold (TBLD2) ranges from about 6 dB to about 12 dB. The offset value in the noise register 398 is supplied to the negative input of the comparator 396. When the background noise signal supplied by the background noise estimator 383 rises above the previously stored estimated value by the amplitude threshold (TBLD2), the output signal from the comparator 396 goes high. The output signal from the comparator 396 is applied to a second input terminal of the OR gate 390, supplying an inhibit signal. The noise value is stored in register 398 when the contents of the SERLE register 370 are updated. To prevent degradation to the ERLE resulting from increases in the near-end noise floor, updates are blocked when the near-end background noise level rises significantly. Specifically, the background near-end noise level is saved when the SERLE value is replaced with the current ERLE value. Updates are blocked when the current near-end noise floor is higher, for example by 6.0 dB, than the saved background noise level.

To track changes in the echo path, the SERLE value stored in register 370 (SERLE) is initialized to zero when filter coefficients to the adaptive filter are cleared (not shown). If the current ERLE at node 366 decreases substantially as a result of a path change, updates may be blocked. By periodically initializing the SERLE value, updates are eventually re-enabled, even for radical path changes. As a result, a supplementary path change detector is not used for handling mild path changes. In systems which anticipate radical path changes, a delay between the path change and complete recovery may be too long, so that a supplementary path-change detector is used.

The operation of initializing SERLE to zero when filter coefficients are cleared is advantageous in comparison to an alternate technique of gradually decreasing the SERLE value. In particular, if SERLE is decreased as the near-end background noise level increases, the actual or current ERLE also decreases, possibly disadvantageously. The disadvantageous condition arises because the loop-gain reduction resulting from the echo canceller operation decreases.

A further disadvantage to gradually decreasing the SERLE value is that updates are often eventually re-enabled during times when the near-end noise floor is elevated. Re-enabling updates during elevated noise conditions is consequential because the ERLE in practical applications is typically limited by the near-end noise level. If the near-end noise level rises and an echo canceller is allowed to update, the ERLE is likely to decrease. Fortunately, the elevated noise likely masks much of the resulting higher echo from the perspective of a far-end listener. Unfortunately, the loop-gain reduction supplied by the echo canceller also decreases. If the far-end relies on the near-end echo canceller for a loop-gain reduction, the loop becomes unstable if the SERLE value is excessively reduced.

A poor ERLE utterance counter 380 counts the number of consecutive ERLE determinations in which echo canceller performance is unsuitable or "poor" and the noise level is not excessive since the last suitable determination. The poor ERLE utterance counter 380 has input terminals that are connected to output terminals of the power estimation circuit 360, the noise estimation circuit 383, and the ERLE calculator 364 so that signal power, noise, and ERLE are monitored. The signal power, noise, and ERLE are monitored to determine whether an utterance is detected, the type of utterance either strong or normal, and whether the echo canceller performance is suitable. An utterance is defined as a transient increase in signal power. The poor ERLE utterance counter 380 generates a count that is compared, using a comparator 328, to a predetermined poor ERLE count threshold (THLD3) from a poor ERLE count register 326 to determine whether the reason for the poor ERLE measurement is the occurrence of an actual or potential path change.

If the comparator 328 determines that the poor_ERLE_ utterance_count is less than or equal to the poor ERLE count threshold (THLD3), then a third update blocking operation takes place as the output signal from the comparator 328 is applied to a third input terminal of the OR gate 390, supplying an inhibit signal that inhibits updating of adaptive filter coefficients.

If the comparator 328 determines that the poor_ERLE_ utterance_count is greater than the poor ERLE count threshold (THLD3), inhibition may still occur. The ERLE is tested at a comparator 332 by comparing ERLE to a poor ERLE threshold (THLD4) from a poor ERLE threshold register 330. When the ERLE is excessively poor but greater than the poor ERLE threshold (THLD4) and the poor_ERLE_ utterance_count is greater than the poor ERLE count threshold (THLD3), an AND-gate 334 generates an output signal that is applied to a fourth input terminal of the OR gate 390, supplying an inhibit signal that inhibits updating of adaptive filter coefficients.

A fifth update blocking operation is controlled by a comparator 338 that is connected to receive an output signal of the background noise estimator 383 that is multiplied by a predetermined factor THLD6, which is represented by a block 340, to supply a product to a positive input terminal of the comparator 338. The negative input terminal of the comparator 338 is connected to the output terminal of the power estimation circuit 362 such that the comparator 338 performs a comparison using a product of the noise estimation and the factor THLD6 as a threshold. The output signal from the comparator 338 is applied to one input terminal of an OR gate 390, which supplies an inhibit signal INH to an adaptive filter on the line 392. The comparator 338 monitors a signal to noise parameter in the form of the ratio of the power estimate of a signal prior to the summing node to the noise estimate based on the power estimate of the signal following the summing node. A suitable threshold (THLD6) is 6 dB. If the signal to noise parameter is less than the threshold (THLD6), the comparator 338 generates an output signal that is applied to a fifth input terminal of the OR gate 390, supplying an inhibit signal that inhibits updating of adaptive filter coefficients.

Figure 4A:
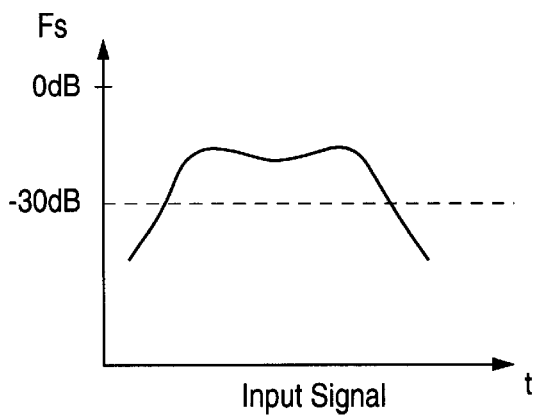
FIGS. 4A–4E are a sequence of graphs illustrating operation of an automatic gain control function performed by the full-duplex speakerphone.
Figure 4B:
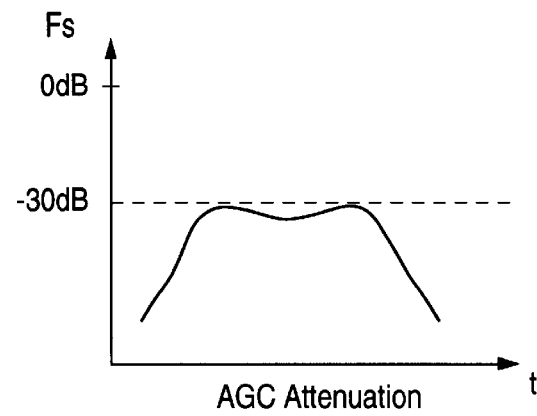
Figure 4C:
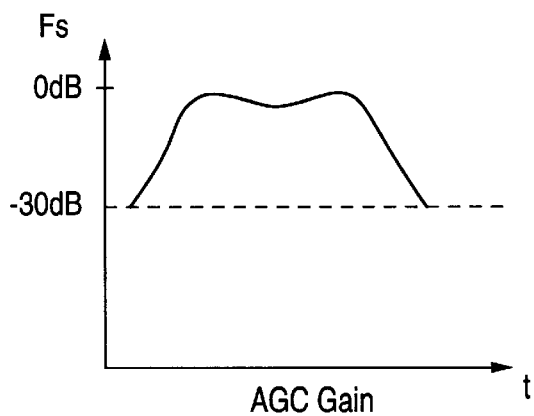
Figure 4D:
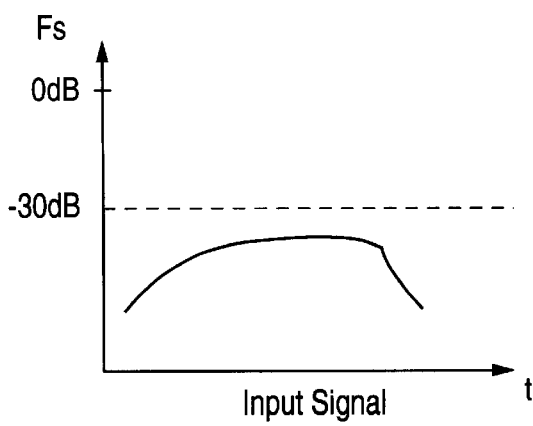
Figure 4E:
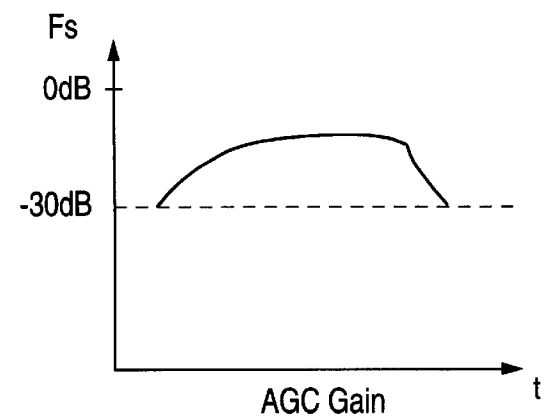

Referring to FIGS. 4A–4E for example, a sequence of graphs illustrates operation of the automatic gain control function. In this example, the AGC operates with a reference level of +30 dB (TVol or RVol=0000). An input signal greater than 30 dB below full-scale as shown in FIG. 4A, is scaled down to 30 dB as an AGC attenuation signal as depicted in FIG. 4B. The AGC attenuation signal is scaled up by the reference level, here +30 dB, to supply an AGC gain signal shown in FIG. 4C. The combination of attenuation and gain results in application of less than +30 dB of total gain. If the input signal is below 30 dB below full-scale as shown in FIG. 4D, no attenuation is performed and the full +30 dB of gain is applied to the signal to yield an AGC gain signal shown in FIG. 4E.

When the reference level is set to +0 dB, the AGC is effectively disabled. The volume control is implemented by digital attenuation in 3 dB steps from the reference level and lower. The gain ranges from the maximum gain of +30 dB to the minimum gain of −12 dB in 3 dB steps. The lowest gain setting (1111) mutes the path. Signal scaling takes place between the network echo canceller 128 and the acoustic echo canceller 152 and therefore does not disturb the echo canceller as changing gain in the echo path does.

ERLE Determination

The Echo Return-Loss Enhancement (ERLE) is a parameter that is advantageously used for multiple purposes in the full-duplex speakerphone integrated circuit 100 including double-talk detection, utterance detection, and suppression. ERLE is a number that expresses the ratio of the level of signal with the echo canceller disabled compared to the level of signal with the echo canceller enabled. ERLE is a measure of the effectiveness of the canceller in eliminating echo.

The ERLE is measured with any potential loops broken. For example, the ERLE of the acoustic echo canceller 152 is measured with the far-end output terminal NO disconnected from the rest of the network to prevent feedback that could occur when all failsafes of the full-duplex speakerphone integrated circuit 100 are disabled.

Figures 5A, 5B:
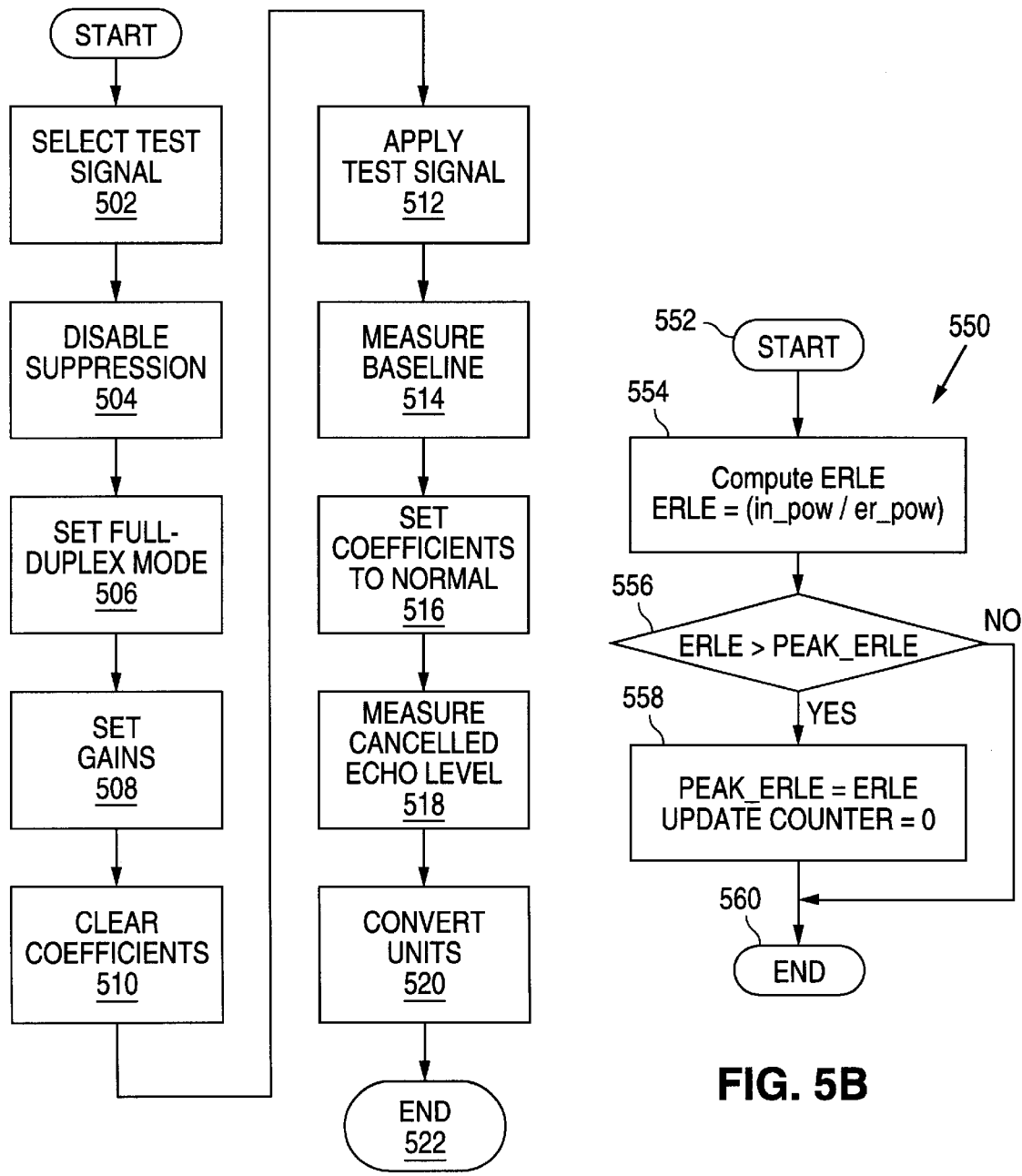
FIGS. 5A and 5B are flow charts depicting examples of a method for measuring Echo Return-Loss Enhancement (ERLE) and a peak ERLE update method, respectively.

Referring to FIG. 5A, a flow chart depicts an example of a routine 500 for measuring the ERLE of the echo canceller. The ERLE expectation is used as a control parameter for discriminating between speech and echo. The designation of signals as speech or echo signals is further used in making suppression gain decisions. For example, the determination, using ERLE, of whether a signal is classified as speech, far-end echo, or double-talk, determines the suppressor operation.

In normal operation with the echo path 214 stationary, the echo canceller estimates a reflection signal. The quality of the estimation determines the degree of echo reduction. Echo Return-Loss Enhancement (ERLE) is a measure of the quality of the estimate and is defined as the reduction in echo power supplied by the echo canceller. Thus the ERLE is the ratio of estimated power in the signal at the output terminal of the echo canceller summing node ($R_{es}$) to the estimated echo power ($S_{in}$), as follows:

$$ERLE = 10\log\frac{E[S_{in}^2]}{E[R_{es}^2]}.$$

E is defined as the expectation operator.

The echo reduction advantageously reduces loop gain. The far-end and near-end of the channel are linked by an acoustic loop. If the loop gain is too high, the loop becomes unstable and produces acoustic howling. If the system at the far-end is a full-duplex speaker phone, the speaker phone operates with a higher output and input gain due to the loop-gain reduction from the near-end echo canceller.

In a select test signal step 502, a suitable test signal is selected. For the full-duplex speakerphone integrated circuit 100, a repeatable speech signal is a suitable speech signal. White noise is not a suitable test signal. In a disable suppression step 504, the transmit suppressor 164 and the receive suppressor 140 are disabled. In a set full-duplex step 506, the half-duplex operation is disabled and all taps are allocated to the acoustic echo canceller 152 to allow full-duplex operation without training the network echo canceller 128. In a set gains step 508, gain levels are set to appropriate levels to attain good system performance.

A clear coefficients step 510 clears coefficients of the acoustic echo canceller 152. In an apply test signal step 512, a test signal is injected at the far-end input terminal NI and the rms voltage is measured at the far-end output terminal NO. The rms voltage measurement corresponds to the baseline coupling level. In a first measurement step 514, a baseline measurement of performance with no echo canceller is acquired.

In a set coefficients to normal step 516, coefficients of the acoustic echo canceller 152 are set to normal values, allowing the adaptive filter 208 to adapt. In a measure canceled echo level step 518, a test signal is injected at the far-end input terminal NI, the adaptive filter 208 adapts for a few seconds, and the rms voltage is measured at the far-end output terminal NO. The rms voltage corresponds to the canceled echo level.

In a convert units step 520, the baseline coupling voltage level and the canceled echo voltage level are converted to decibels. In a calculate ERLE step 522, the echo canceled level is subtracted from the baseline coupling level to yield the ERLE. A typical ERLE measured using input speech signals is about 30 dB.

Referring to FIG. 5B, a flow chart depicts an example of a routine 550 for updating a peak ERLE measurement. The update peak ERLE routine 550 begins 552 by computing the ERLE 554. The computed ERLE measurement is then compared 556 to a current peak ERLE value. If the current ERLE measurement is greater than the peak ERLE value, then an update peak ERLE operation 558 sets the value of peak ERLE to the current ERLE measurement. The update peak ERLE operation 558 also initializes an ERLE update counter to zero.

The ERLE update counter maintains a count of the valid updates to the adaptive filter 208 since a most recent ERLE plateau occurred. The ERLE update counter is a measure of effort expended between ERLE plateaus.

Double-Talk Detection

Double-talk is a condition in which a near-end speaker and a far-end speaker are speaking simultaneously.

Referring to FIGS. 6A through 6E, several flowcharts depict several aspects of a double-talk and path detection operation.

Figure 6A:
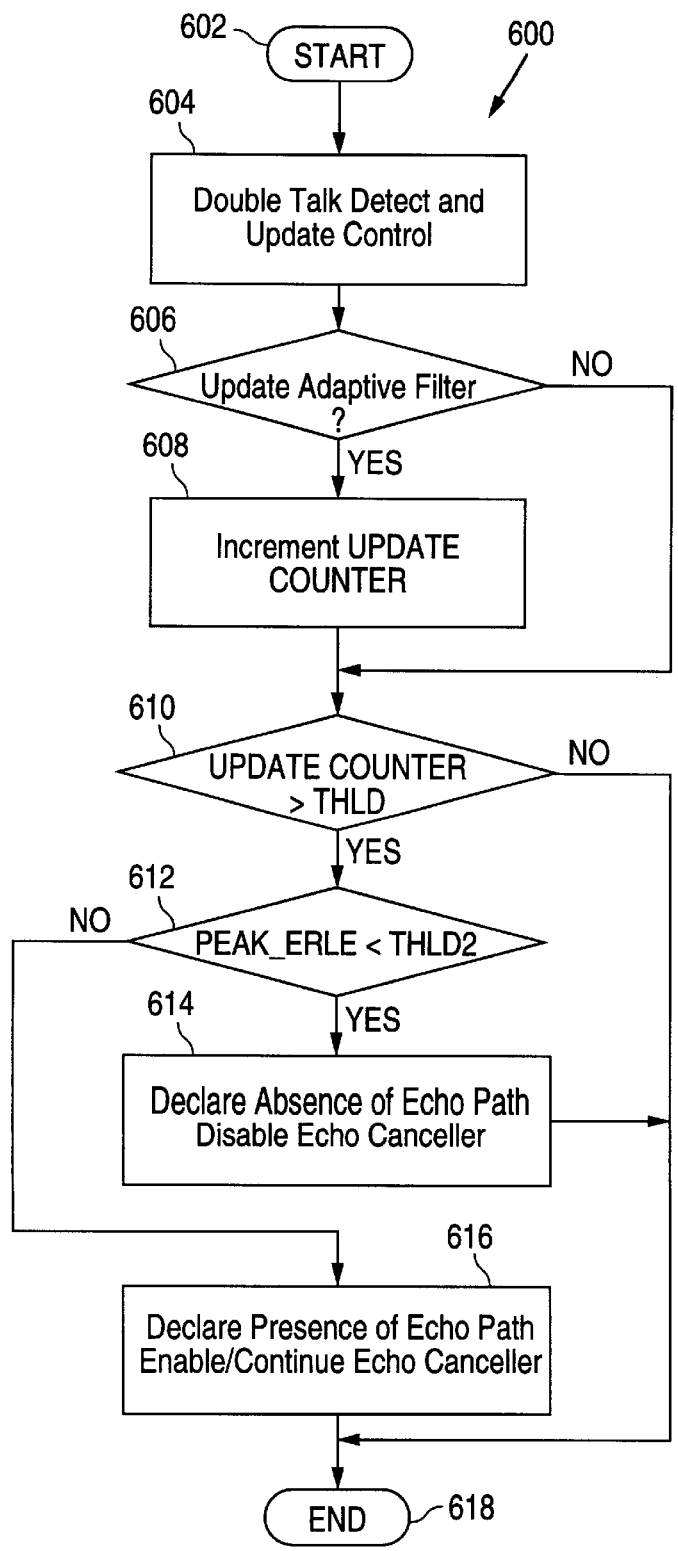
FIGS. 6A through 6E are flowcharts that depict several aspects of a double-talk and path detection operation.

Referring to FIG. 6A, a flowchart illustrates an embodiment of a routine 600 for determining and declaring the presence of an echo path. The echo path presence detection routine 600, begins 602 and executes a double talk detection operation and update control operation 604. The double talk detection and update control operation 604 is described in more detail in the discussion of FIG. 6B. Following double talk detection and update control operations, the echo path presence detection routine 600 tests to determine whether updating of the adaptive filter 208 is allowed or blocked in an update adaptive filter decision block 606. If adaptive filter updating allowed, the ERLE update counter is incremented 608 and compared to a counter threshold (THLD) in an update counter decision block 610. The ERLE update counter is initially set in the update peak ERLE routine 550. If adaptive filtering is blocked, the ERLE update counter is compared to the counter threshold in the update counter decision block 610 without updating.

The update counter decision block 610 compares the ERLE update counter to a selected time duration threshold. A suitable time duration threshold (THLD) is about one second. If the ERLE update counter does not exceed the time duration threshold, then the echo path presence detection routine 600 terminates 618 and a decision is deferred. Otherwise, the ERLE update counter is larger than the time duration threshold and the peak ERLE is compared to an ERLE threshold (THLD2) in a test peak ERLE decision block 612. A suitable ERLE threshold (THLD2) ranges from about 6 dB to about 12 dB. If the peak ERLE is greater than or equal to the ERLE threshold (TBLD2), then a declare echo path present block 614 designates that the echo path is present and allows continued use of the echo canceller, then terminates 618 the echo path presence detection routine 600. Otherwise, the peak ERLE is less than the ERLE threshold (THLD2) and a declare echo path absent block 616 designates that the echo path is absent and disables the echo canceller, then terminates 618 the echo path presence detection routine 600.

The echo path presence detection routine 600 is used both to make one-time echo path presence detection decisions via an individual activation of an echo path presence test, and to continually monitor for reappearance of an echo path. An example scenario of a system that continually monitors for return of an echo path is a digital station-to-station call through a Private Branch Exchange (PBX) and a subsequent "conferencing" of a call through a Public Switched Telephone Network (PSTN). The PBX has with no network echo or reflection. The PSTN has network reflections at a 2–4 wire hybrid connection.

In some embodiments, the declare echo path absent block 616 tests the amount of noise present and, depending on the noise level, selectively defers a declaration that the echo path is absent. Deferral of the declaration is useful since noise obscures detection of the path so that an echo may become lost in the noise.

Figure 6B:
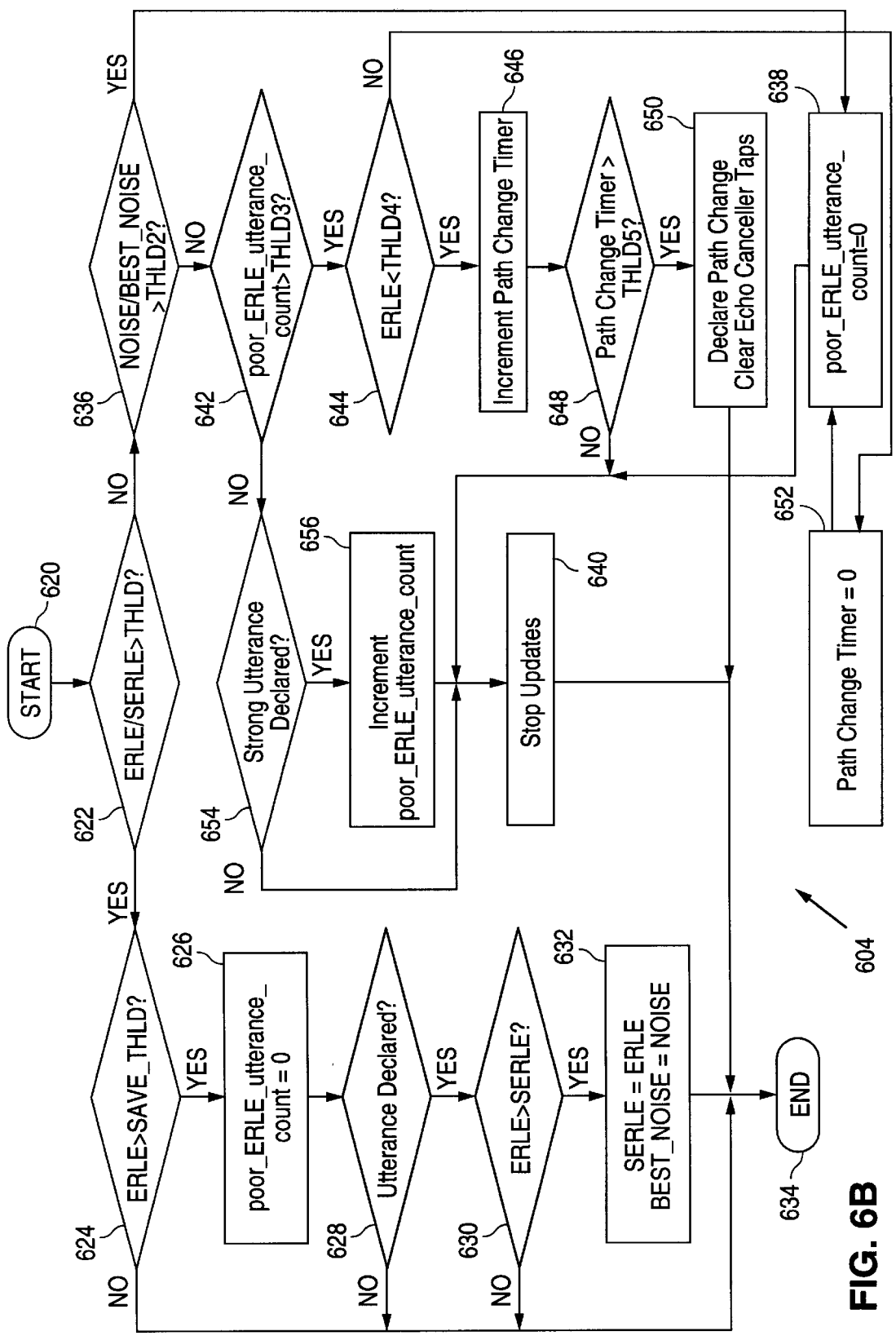

Referring to FIG. 6B, a flowchart illustrates an embodiment of a update control operation 604 that is suitable for usage in the echo path presence detection routine 600. The update control operation 604, in addition to controlling updating of the adaptive filter, also detects path changes. The update control operation 604 begins in a start block 620 and proceeds under an assumption that updates are made at the taps of the echo canceller unless the update control operation 604 blocks updating.

The update control operation 604 first compares the current ERLE to SERLE, a stored "best value" of ERLE. In an illustrative embodiment, the SERLE best value is a largest ERLE value. The ratio ERLE/SERLE is compared to an ERLE threshold (THLD) in an ERLE thresholding decision block 622. A suitable ERLE threshold (TELD) is 0.5. If the ERLE/SERLE ratio is greater than THLD, the ERLE indicates that the echo canceller performance is suitable in comparison to the SERLE best value and therefore merits testing in comparison to a save ERLE threshold (SAVE_THLD) in a SERLE thresholding decision block 624. The save ERLE threshold (SAVE_THLD) is a minimum suitable value for the SERLE best value and corresponds to the NErle and AErle fields of the microcontroller interface 112 register MCR 4. If the ERLE threshold is less than or equal to the save ERLE threshold (SAVE_TILD) then the update control operation 604 terminates 634. Otherwise, the ERLE threshold is greater than the save ERLE threshold (SAVE_THLD) and a poor_ERLE_utterance_count parameter is initialized to zero in a reset poor ERLE counter operation 626. The poor_ERLE_utterance_count parameter indicates the number of consecutive ERLE determinations in which echo canceller performance is unsuitable or "poor" and the noise level is not excessive since the last suitable determination.

Following the reset poor ERLE counter operation 626, a test for utterance declared decision block 628 tests to determine whether an utterance is detected in the signal path leading to the input terminal of the echo canceller. An utterance is defined by a transient increase in signal power in the signal path, either the receive path 202 or the transmit path 204, that exceeds a predetermined threshold level that is typically defined in signal to noise ratio (SNR). If an utterance is not declared, then the update control operation 604 terminates 634. Otherwise, an utterance is declared and the ERLE value is directly compared to the SERLE best value 630.

If the ERLE does not exceed the SERLE best value, no updating of the SERLE best value is warranted so that the update control operation 604 terminates 634. Otherwise, the ERLE is better than the SERLE best value so an update SERLE operation 632 sets the SERLE best value to the current ERLE, sets a background noise level BEST_NOISE measurement equal to the current noise floor NOISE measurement acquired at the time of the new SERLE best value measurement, and terminates 634 the update control operation 604.

When the ERLE thresholding decision block 622 determines that the ERLE/SERLE ratio is less than or equal to THLD, the ERLE indicates that the echo canceller performance is unsuitable or poor in comparison to the SERLE best value. When the ERLE value is poor, the noise level is tested in a noise thresholding decision block 636 which compares a noise ratio NOISE/BEST_NOISE to a predetermined noise threshold (THLD2). A suitable noise threshold (THLD2) is 6.0 dB, for example. The noise ratio NOISE/BEST_NOISE is a measure of the current noise measurement to the noise measurement acquired for the SERLE best value. If the noise ratio NOISE/BEST_NOISE is greater than the noise threshold (THLD2), the current noise level is an unsuitable level and the poor_ERLE_utterance_count parameter is initialized to zero in a reset poor ERLE counter operation 638. Following the reset poor ERLE counter operation 638, updating is blocked in a block updates operation 640 and the update control operation 604 is terminated 634. To prevent unnecessary degradation to the ERLE due to rises in the near-end noise floor, updates are blocked when the near-end background noise level rises significantly. In particular, the background near-end noise level or the far-end background noise-power is saved whenever the SERLE value is replaced with the current ERLE value. Updates are blocked whenever the current noise floor NOISE is higher than the saved background noise level BEST_NOISE. The technique uses an assumption that either radical path changes will not occur while updates are blocked due to updated near-end noise, or that a supplementary path-change detector is available.

When the noise thresholding decision block 636 determines that the noise ratio NOISE/BEST_NOISE does not exceed the noise threshold (THLD2), the poor ERLE_utterance_count is compared to a predetermined poor ERLE count threshold (THLD3) in a determine poor ERLE cause decision block 642. The determine poor ERLE cause decision block 642 determines whether the reason for the poor ERLE measurement is the occurrence of an actual or potential path change.

If the poor_ERLE_utterance_count is greater than the poor ERLE count threshold (THLD3), then the ERLE is tested by comparing ERLE to a poor ERLE threshold (THLD4) in a poor ERLE thresholding decision block 644. When the ERLE is excessively poor and less than the poor ERLE threshold (THLD4), a path change timer is incremented 646 and then compared to a path change duration threshold (THLD5) in a test path change timer decision block 648. The poor ERLE count threshold (THLD3), the poor ERLE threshold (THLD4), and the path change duration threshold (TBLD5) are strongly correlated and predefined to determine sensitivity of the update control operation 604 to path changes. If the count of the path change timer is exceeds the path change duration threshold (THLD5), then a path change is detected and declared in a declare path change operation 650. The declare path change operation 650 also includes the operation of clearing the echo canceller taps and initializing the SERLE best value of ERLE to zero. The echo canceller taps are cleared for a path change since, upon the occurrence of a path change, the current ERLE likely goes negative until reconvergence occurs. By clearing the coefficients when the path change occurs, less echo is transmitted back to the far-end, and reconvergence is attained faster. When the coefficients are cleared, SERLE is also initialized to zero.

A path change is declared when a sequence of ERLE measurements indicate several operating conditions. First, the echo canceller performance is unsuitable in comparison to the SERLE best value. Second, the current noise floor NOISE is moderate or not excessive in comparison to the saved background noise level BEST_NOISE. Third, the combined conditions of a poor ERLE but moderate NOISE endure for a predetermined number of ERLE measurements. Fourth, a consecutive sequence of ERLE measurement values remains below a predetermined threshold for a selected path change timer duration. When the declare path change operation 650 is complete, the update control operation 604 terminates 634.

If, as determined by the test path change timer decision block 648, the path change timer does not exceed the path change duration threshold (THLD5), then updating is blocked in a block updates operation 640 and the update control operation 604 is terminated 634. Therefore, updates are blocked not only when the near-end background noise level rises significantly, but also when a path change is imminent but awaiting verification. Generally, unless a path change is declared updates are blocked or inhibited whenever the current ERLE is less than the SERLE stored in register by a predetermined fraction of the SERLE. In contrast, conventional systems typically utilize a fixed signal threshold to trigger update blocking. The advantage of utilizing a fraction of the SERLE instead of a fixed signal threshold is that small changes in the echo path or training-signal characteristics are accommodated without compromising convergence speed.

If, as determined by the poor ERLE thresholding decision block 644, the ERLE is not excessively poor and is greater than or equal to the poor ERLE threshold (THLD4), then the path change timer is initialized to zero in an initialize path change timer operation 652. The poor_ERLE_utterance_ count parameter is initialized to zero in a reset poor ERLE counter operation 638. Following the reset poor ERLE counter operation 638, updating is blocked in a block updates operation 640 and the update control operation 604 is terminated 634.

When the determine poor ERLE cause decision block 642 detects that the poor_ERLE_utterance_count is less than or equal to the poor ERLE count threshold (TBLD3), a strong utterance condition decision block 654 determines whether a strong utterance has been declared. An utterance is detected in a signal path, either the receive path 202 or the transmit path 204, leading to the input terminal of the echo canceller. A strong utterance is an utterance that is detected which has a signal to noise ratio (SNR) of a predetermined strong utterance threshold or greater. In an illustrative embodiment, a suitable strong utterance threshold is 12 dB. If a strong utterance has been declared, an increment poor ERLE count operation 654 increments the poor_ERLE_ utterance_count and updating is blocked in a block updates operation 640 and the update control operation 604 is terminated 634.

If a strong utterance has not been declared, as determined by the strong utterance condition decision block 654, updating is blocked in a block updates operation 640 and the update control operation 604 is terminated 634.

Figure 6C:
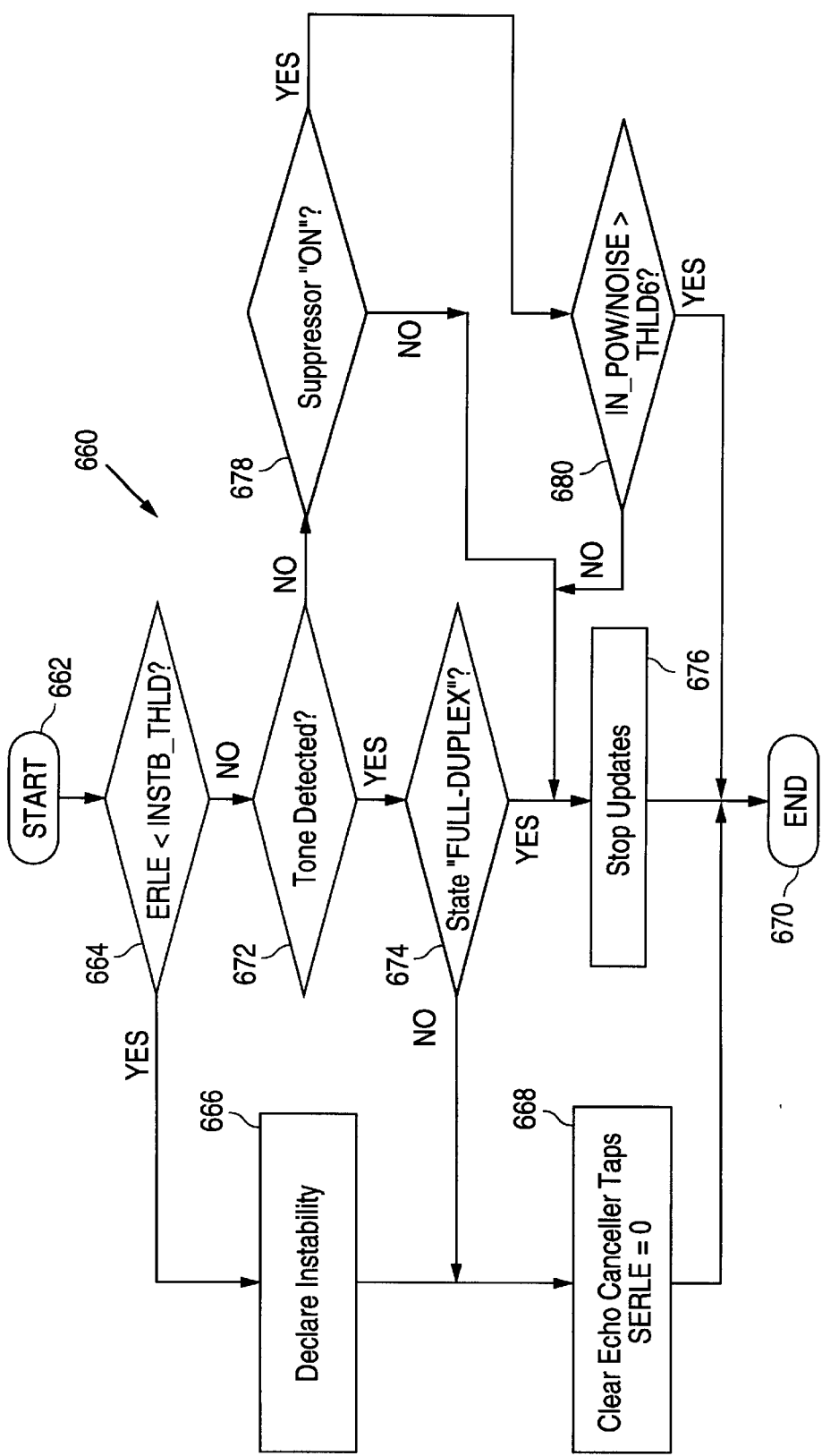

Referring to FIG. 6C, a flowchart illustrates an embodiment of a detect instability operation 660 that is suitable for usage in the double talk detection and update control operation 604. The detect instability operation 660 takes place in a signal path following a computation of ERLE.

Near end noise can interfere with an echo canceller's estimation of a path response. For example, near-end stationary noise sets an upper bound on the ERLE that an echo canceller generates for a particular adaptive filter update gain. Stationary near-end noise therefore limits the loop-gain reduction supplied by the echo canceller. If near-end noise level is too high, the echo canceller may not supply sufficient loop-gain reduction to prevent instability while uncancelled residual echo is still largely masked by the near-end noise from the perspective of the far-end listener. As a result, stationary noise undesirably limits the ERLE but may not cause the echo to rise to objectionable levels from the perspective of the far-end listener.

The detect instability operation 660 begins in a start block 662 then determines whether the current ERLE value is less than an instability threshold INSTB_TBLD in a test for instability decision block 664. If the current ERLE value is less than an instability threshold INSTB_THLD, then the detect instability operation 660 declares the occurrence of an instability in a declare instability operation 666, clears the echo canceller filter taps and initializes the SERLE best value of ERLE to zero in a clear canceller taps operation 668, then terminates 670.

If the ERLE is greater than or equal to the instability threshold INSTB_THLD, as determined by the test for instability decision block 664, then a tone status decision block 672 to determine whether a tone is currently detected. The instability threshold INSTB_THLD is strictly set to a value less than the poor ERLE threshold (THLD4), indicating that the echo canceller performance is highly unsuitable to the point of instability. One suitable response when an instability is detected is to terminate operation in a full-duplex mode and begin operating in the half-duplex mode. If a tone is currently detected, a current state decision block 674 directs that a system operating in the full-duplex state transition to a block updates operation 676, then terminates 670 the detect instability operation 660. The block updates operation 676 temporarily blocks updating of the adaptive filter 208.

Blocking of updates in the full-duplex state is advantageous following a tone detection because tones are, by definition, periodic signals and the adaptive filter 208 trains signals very differently depending on whether the training signal is periodic or aperiodic. A tone causes an instantaneous disruption in the ERLE value so that the system functions unpredictably. By blocking updates upon detection of a tone, unpredictable system behavior is avoided. In the half-duplex state in which the echo canceller continues to train, advantageous functionality is gained by clearing the adaptive filter coefficients.

Blocking of coefficient updates during operations in the full-duplex mode is advantageous, for example, to control noise in the form of near-end speech from the perspective of the far-end listener. For a far-end listener, a type of nonstationary "noise" is near-end speech. Near-end speech typically does not occur at the same time as far-end speech, so that near-end speech does not reliably mask echo. If an echo canceller is allowed to adapt while near-end speech is present, ERLE in the absence of near-end speech is significantly degraded. Therefore, updates are advantageously blocked while near-end speech is present. The update blocking operation is attained using the double-talk detector, which is operable to control the time that coefficient updates are allowed.

If the current state decision block 674 directs that the system is not operating in the full-duplex mode, then the clear canceller taps operation 668 clears the echo canceller filter taps and initializes the SERLE best value of ERLE to zero, then terminates 670 the detect instability operation 660.

If the tone status decision block 672 determines that a tone is not currently detected, a suppressor On decision block 678 directs the operation of the detect instability operation 660. The suppressor On decision depends upon whether a suppressor, either the transmit suppressor 164 or the receive suppressor 140, has determined that only "echo" is present at the echo canceller summing node. If the suppressor is activated or On, the suppressor has determined that only "echo" is present following the echo canceller summing node.

If the suppressor is activated (On), then the signal to noise ratio of the current signals are analyzed in a test signal to noise decision block 680. The signal to noise parameter analyzed is the ratio of the power estimate of a signal prior to the summing node to the noise estimate based on the power estimate of the signal following the summing node. Specifically, for the far-end signal, the signal to noise ratio is described as fe_in_pow/fe_noise and, for the near-end signal, the signal to noise ratio is described as ne_in_pow/ne_noise. The signal to noise parameter is compared to a threshold (TBLD6). A suitable threshold (THLD6) is 6 dB. If the signal to noise parameter exceeds the threshold (THLD6), the detect instability operation 660 terminates 670. Otherwise, the signal to noise parameter does not exceed the threshold (TBLD6) and the block updates operation 676 blocks updating of the adaptive filter 208, and the detect instability operation 660 terminates 670.

If the suppressor On decision block 678 determines that the suppressor is Off or not activated, then block updates operation 676 blocks updating of the adaptive filter 208, and the detect instability operation 660 terminates 670.

Figure 6D:
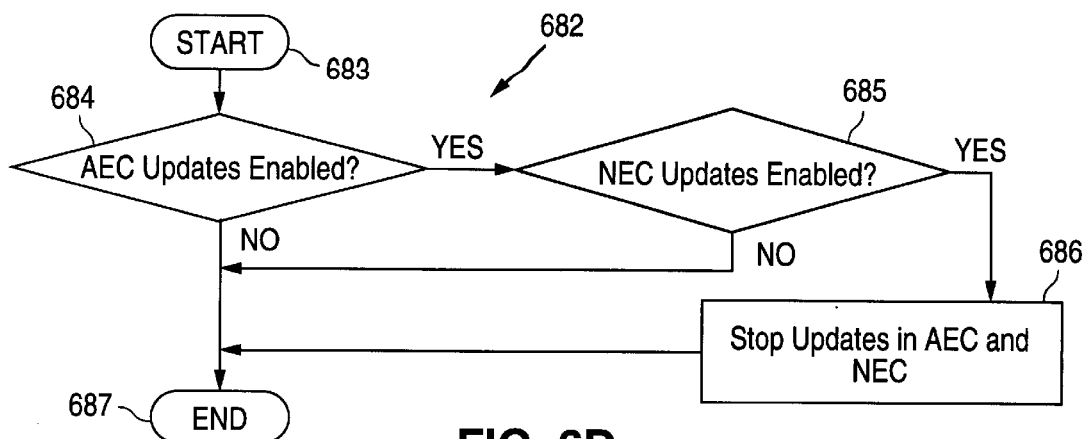

Referring to FIG. 6D, a flowchart illustrates an embodiment of a control dual channel updating operation 682 that is suitable for usage in the double talk detection and update control operation 604. The control dual channel updating operation 682 is activated when a block updates operation, such as the block updates operation 676 or the block updates operation 640, is performed. The control dual channel updating operation 682 coordinates updating of the adaptive filters in the receive path 202 and the transmit path 204.

The control dual channel updating operation 682 begins in a start block 683 then determines whether adaptive filter updates in the acoustic echo canceller (AEC) are enabled in an AEC updates enabled decision block 684. If AEC updates are enabled, a NEC updates enabled decision block 685 determines whether adaptive filter updates in the network echo canceller (NEC) are enabled. If both AEC and NEC updates are enabled, a stop updates in AEC and NEC operation 686 blocks adaptive filter updating in both the AEC and the NEC. If either AEC or NEC updating is disabled, updating in neither channel is blocked.

Figure 6E:
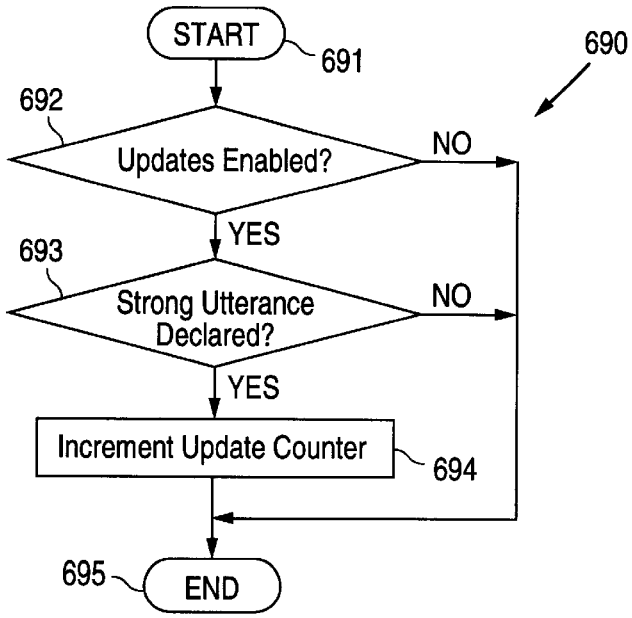

Referring to FIG. 6E, a flowchart illustrates an embodiment of an update counter control operation 690 that shows the update adaptive filter decision block 606 and increment ERLE update counter 608 operations in additional detail. The update counter control operation 690 begins 691 upon activation following completion of the double talk detection operation and update control operation 604 shown in FIG. 6A. The update control operation 604 is shown in more detail in the update control operation 604, the detect instability operation 660, and the control dual channel updating operation 682 shown in FIGS. 6B, 6C, and 6D. An updates enabled decision block 692 permits incrementing of the update counter only if updates are enabled. If so, a strong utterance decision block 693 permits incrementing of the update counter only if a strong utterance is declared. If so, an increment update counter operation 694 increments the update counter, then terminates 695 the update counter control operation 690.

Supplemental Echo Suppression

The term "echo cancellation" does not precisely state the operation performed since an echo is merely attenuated and not entirely canceled. Some residual echo remains after the summing node. Therefore, the term "echo suppression" more accurately defines the process of reducing residual echo in the full-duplex speakerphone integrated circuit 100. The residual echo has a low amplitude but may be audible when a near-end speaker is not speaking. Echo suppression is used to reduce residual echo both in the transmit path 204 (acoustic residual echo suppression) and in the receive path 202 (network residual echo suppression).

An echo suppressor is used to control the attenuators in the transmit path 204 and the receive path 202 to selectively set the attenuations based on the signal received from the far-end and the signal transmitted from the near-end. The attenuation levels are set to allow full-duplex communication. If both ends supply speech signals simultaneously, the attenuation is reduced, increasing the clarity of signals at both ends. Attenuation levels are also set when both ends are idle. If, however, the far-end user is talking and the near-end user is silent, and the echo at the near-end is low, then the attenuation is set high. Echo suppression is a nonlinear process that further attenuates the echo signal.

Supplementary Echo Suppression is a dynamic attenuation placed in the opposite path of the active path to mask residual echo. For example, if the receive path 202 is active, then the transmit path 204 is attenuated. When both paths are simultaneously active, the suppression attenuation is removed.

The full-duplex speakerphone integrated circuit 100 employs supplementary echo suppression which further attenuates beyond the level of attained by cancellation to remove the residual echo. In one example, the transmit suppressor 164 in the transmit channel executes extra attenuation when only the far-end speaker is speaking. If the near-end speaker begins speaking, the attenuation is removed and the system relies on the near-end speaker's speech to mask the residual echo.

Suppression causes some modulation of the perceived background noise which may be distracting to some users. The transmit suppression attenuation control, TSAtt, bits 15-14 in MCR3 are used to limit the suppression in the transmit channel to a suitable level. Receive suppression by the receive suppressor 140 attenuates by 24 dB in an illustrative embodiment.

In the illustrative embodiment, transmit suppression in the transmit suppressor 164 and receive suppression in the receive suppressor 140 are fundamentally different operations. Transmit suppression works in one of two modes default_on and default_off mode, while receive suppression is a default_on mode.

In the default_on mode, a suppressor is normally active but becomes inactive when suppression is not desirable. Therefore in the default_on mode, the transmit suppressor disengages when near-end speech or double-talk occur. The suppressor is disengaged because the speech signals from near-end speech and double-talk mask the residual echo without assistance from the suppressor. In the default_on mode the suppressor operates as a noise guard.

In the default_off mode, a suppressor is normally inactive but becomes active when signals are present to be suppressed. Therefore in the default_off mode, the transmit suppressor engages when only far-end speech is occurring.

Both transmit suppression and receive suppression utilize analysis of Echo Return-Loss Enhancement (RLE), a measure of echo canceller performance that specifies the amount of attenuation in dB of echo signal that an echo canceller supplies, not including suppression. The larger an ERLE value, the better the echo cancellation.

The transmit suppressor 164 attenuates the transmit path in a default_off mode when only far-end speech is present so that suppression engages only when warranted. The purpose of transmit suppression is to mask residual echo by inserting additional loss/attenuation in the transmit path in the scenario when only far-end speech is present. The residual echo, if any, in double-talk is masked by near-end speech assuming reasonable levels of ERLE.

Two controls or tweekable parameters, TSThd and TSBias, are supplied in the microcontroller interface 112 to govern the behavior of transmit suppression. TSThd is controlled by bits 7-6 in MCR3 and is the transmit suppression threshold. TSBias is controlled by bits 5-4 in MCR3 and is the transmit suppression bias.

TSThd is a primary control and is adjusted before changing the value of TSBias from a default setting. TSThd sets the ERLE expectation that is used to discriminate between near-end speech and far-end echo. The TSThd control setting predominately determines the behavior of transmit suppression.

TSBias is a secondary control and is adjusted after a system designer is generally satisfied with the TSThd setting and the behavior of transmit suppression. TSBias affects the facility with which a near-end speaker disengages transmit suppression and maintains disengagement of transmit suppression. Larger values of TSBias are preferred relative to TSThd settings facilitate near-end speech transmission. In one example, a default setting for TSThd is 15 dB and a default setting for TSBias is 18 dB.

In some scenarios, specifically when the dynamic range of volume control (TVol or RVol) is significantly large, advantages are gained by using different combinations of TSThd and TSBias setting relative to output volume of the acoustic interface 122.

The receive suppressor 140 attenuates the receive path using a default_on mode in which the receive suppressor is nominally attenuating unless far-end speech is present. The default_on behavior is consistent with behavior observed in modem speakerphones and maintains low noise levels at the speaker.

A side effect of the receive suppression technique is that a constant power signal, such as noise from a noise generator or a tone, is eventually attenuated when a rise in the background noise level estimate deactivates the receive suppression speech detector.

One control, RSThd, is supplied in the microcontroller interface 112 to govern the behavior of receive suppression. RSThd is controlled by bits 13-12 in MCR2 and is the receive suppression threshold which sets the threshold of speech detection.

Figure 7:
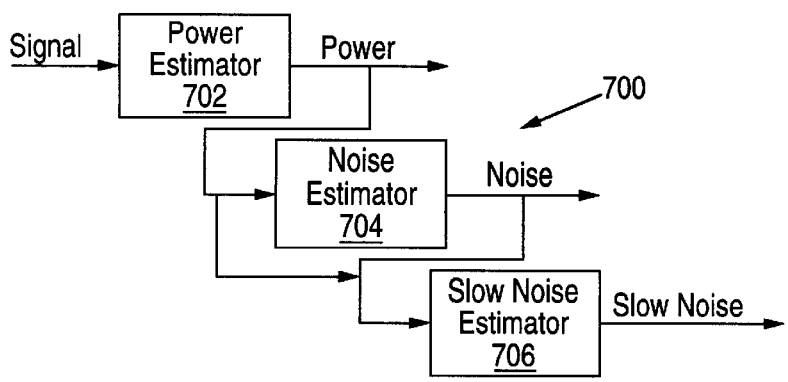
FIG. 7 is a schematic block diagram illustrating a normalized power estimate system for determining noise parameters for usage in the transmit suppressor and the receive suppressor.

Referring to FIG. 7, a schematic block diagram illustrates a normalized power estimate system 700 for computing power and noise parameters for usage in the transmit suppressor and the receive suppressor. Suppression attenuation decisions are determined on the basis of normalized power estimates that are computed for both the transmit path 204 and the receive path 202. The normalized power estimates are power estimates that are normalized to a background power estimate that is indicative of background noise.

The power and noise parameters are used to determine engagement and disengagement of the suppressors. A signal is input to a power estimator 702 to produce a power signal. The power signal is input to a noise estimator 704 to produce a noise signal. Both the power signal and the noise signal are input to a slow noise estimator 706 which determines a slow noise signal based on a ratio of the power signal to the noise signal. Thus, the slow noise is a secondary, lower variance background power estimate that is derived from a background power estimate. The background power estimate, in turn, is derived from a power estimate of an input signal. The slow noise parameter is advantageously used as a control parameter in the suppressors since the slow noise varies less and is more stable than the noise signal.

The ERLE expectation is used as a control parameter to discriminate between speech signals and echo signals which, in turn, is used to make suppression gain decisions. In the illustrative embodiment, the ERLE expectation is set as TSThd, the transmit (Tx) suppression threshold in register MCR 3. Several peak-detected power estimates, including a peak_fe_in_code, a peak_ne_in_code, a peak_nc_error_code, and a peak_ec_error_code, are normalized to slow noise levels and used in combination with the ERLE expectation value. The ERLE expectation TSThd discriminates between speech and echo to determine whether to engage or disengage suppression. A fixed amount of attenuation is gradually engaged or disengaged depending on the decision.

Referring to FIGS. 8A–8D, several flow diagrams illustrate a suppression technique for suppressing echoes in a full-duplex speakerphone, such as the full-duplex speakerphone integrated circuit 100 shown in FIG. 1. Several user-selected parameters including threshold, bias, and mode parameters control the receive and transmit suppressors.

Figure 8A:
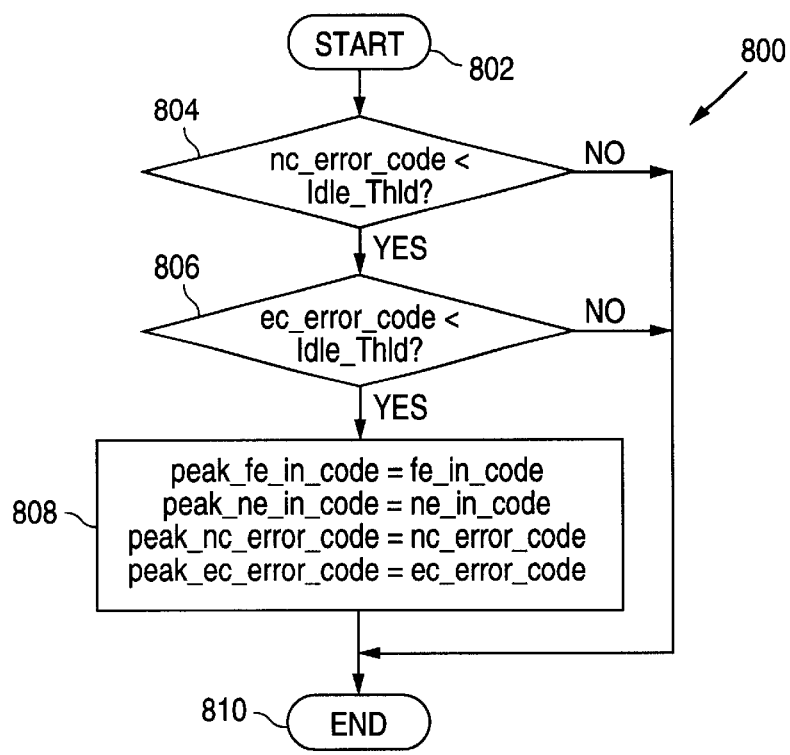
FIGS. 8A, 8C, and 8D are flow diagrams that illustrate a suppression technique for suppressing echoes in a full-duplex speakerphone
Figure 8B:
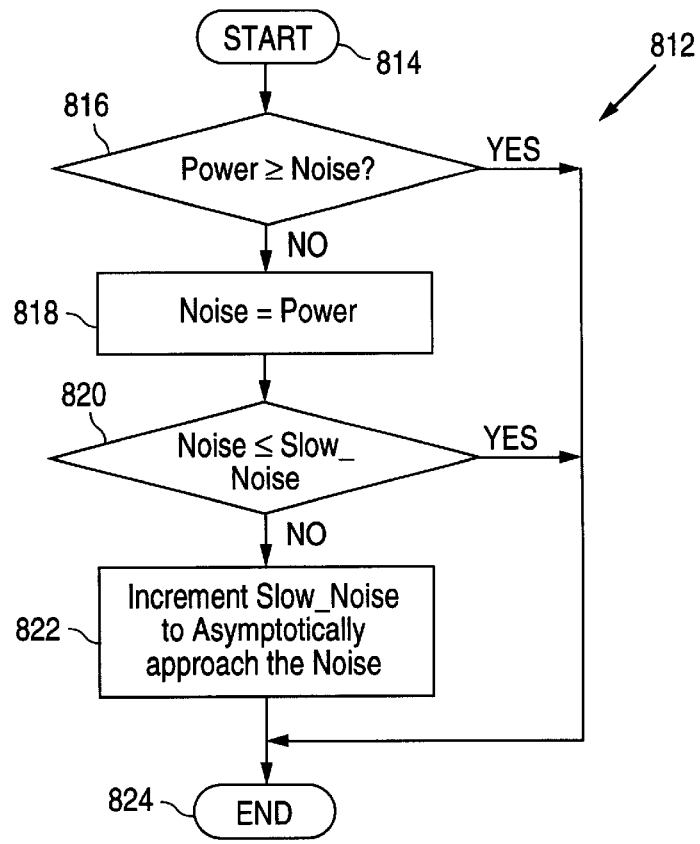
FIG. 8B shows a slow noise determination technique.
Figure 8C:
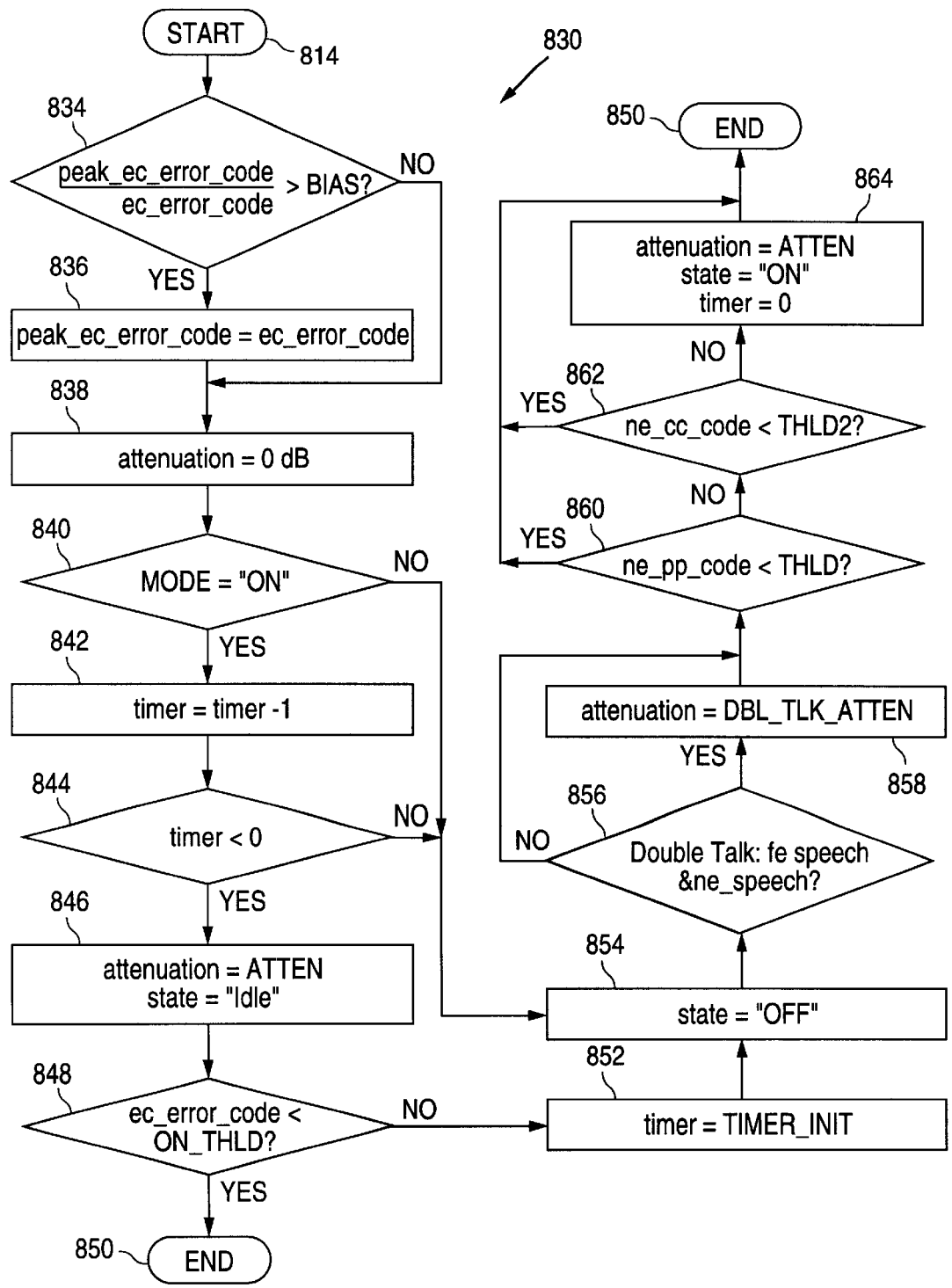
Figure 8D:
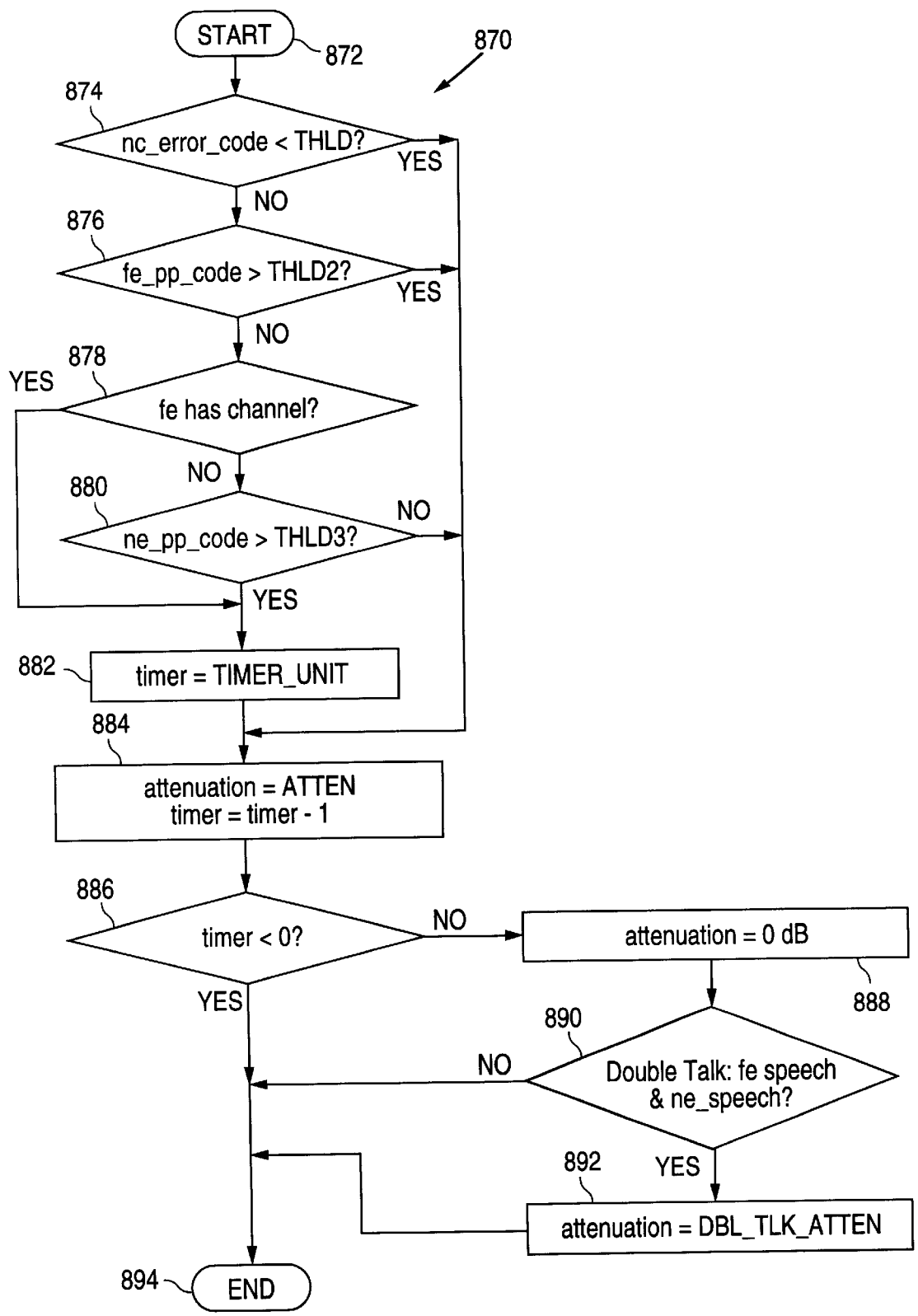

Referring to FIG. 8A, a flow diagram depicts a technique for resetting or updating peak codes that are used during application of the echo suppression techniques described in conjunction with FIGS. 8C and 8D. The operation for resetting peak codes 800 is executed by the receive suppressor 140 and the transmit suppressor 164 in the full-duplex speakerphone integrated circuit 100 shown in FIG. 1 as data in the transmit path 204 and the receive path 202 are acquired.

The reset operation begins 802 and performs two test operations 804 and 806 to determine whether the peak codes are to be reset. The peak codes include peak_fe_in_code, peak_ne_in_code, peak_nc_error_code, and peak_ec_error_code.

Signals in the receive path 202 are acquired to determine peak_fe_in_code. The peak-fe_in_code parameter is a running maximum value of fe_in_code and therefore determined as max(peak_fe_in_code, fe_in_code). The far-end signal fe_in_code parameter is calculated as a ratio (fe_in_pow/slow_fe_noise). The fe_in_pow parameter is a power estimate of a signal in the receive path 202 prior to the NEC summing node 130. The slow_fe_noise parameter is a slow noise estimate derived from fe_noise. The fe_noise parameter is a noise estimate based on nc_error_pow, a power estimate of a signal in the receive path 202 following the NEC summing node 130.

Signals in the transmit path 204 are acquired to determine peak_ne_in_code. The peak-ne-in_code parameter is a running maximum value of ne_in_code and therefore determined as max(peak_ne_in_code, ne_in_code). The near-end signal ne_in_code parameter is calculated as a ratio (ne_in_pow/slow_ne_noise). The ne_in_pow parameter is a power estimate of a signal in the transmit path 204 prior to the AEC summing node 160. The slow_ne_noise parameter is a slow noise estimate derived from ne_noise. The ne_noise parameter is a noise estimate based on ec_error_pow, a power estimate of a signal in the transmit path 204 following the AEC summing node 160.

Signals in the receive path 202 are acquired to determine peak_nc_error code. The peak_nc_error_code parameter is a running maximum value of nc_error_code and is therefore determined as max(peak_nc_error_code, nc_error_code). The nc error code parameter is calculated as a ratio (nc_error_pow/slow_fe_noise) and expresses the signal to noise ratio of far-end signal to far-end noise following the NEC summing node 130.

Signals in the transmit path 204 are acquired to determine peak_ec_error_code. The peak_ec_error_code parameter is a running maximum value of ec_error_code and is therefore determined as max(peak_ec_error_code, ec_error_code). The ec_error_code parameter is calculated as a ratio (ec_error_pow/slow_ne_noise) and expresses the signal to noise ratio of near-end signal to near-end noise following the AEC summing node 160.

A test far-end signal error code operation 804 compares nc_error_code to idle threshold idle_thd. The idle threshold idle_thd is a threshold below which the signal to noise ratio (SNR) indicates that the channel is idle so that no speech activity is occurring. If nc_error_code is greater than the idle threshold idle_thd, then the operation for resetting peak codes 800 terminates 810. Otherwise, nc_error_code is less than the idle threshold idle_thd so that the near-end signal is tested in a test near-end signal error code operation 806.

The test near-end signal error code operation 806 compares ec_error_code to idle threshold idle_thd. If ec_error_code is greater than the idle threshold idle_thd, then the operation for resetting peak codes 800 terminates 810. Otherwise, ec_error_code is less than the idle threshold idle_thd so that the peaks are reset in a reset peak codes operation 808.

The reset peak codes operation 808 resets the peak codes including peak_fe_in_code, peak_ne_in_code, peak_nc_error_code, and peak_ec_error_code. The peak_fe_in_code is set to the current value of fe_in_code, the ratio (fe_in_pow/slow_fe_noise) designating the signal to noise ratio prior to the NEC summing node 130. The peak ne_in_code is set to the current value of ne_in_code, the ratio (ne_in_pow/slow_ne_noise) designating the signal to noise ratio prior to the AEC summing node 160. The peak_nc_error_code is set to the current value of nc_error_code, the ratio (nc_error_pow/slow_fe_noise) designating the signal to noise ratio following the NEC summing node 130. The peak_ec_error code is set to the current value of ec_error_code, the ratio (ec_error_pow/slow_ne_noise) designating the signal to noise ratio following the AEC summing node 160. When the peak codes are reset, the operation for resetting peak codes 800 terminates 810.

Referring to FIG. 8B, a flow chart illustrates a operation for computing slow noise (slow ne_noise and slow_fe noise). The operation for computing slow noise 812 begins 814 as data is acquired in the transmit path 204 at the near-end input terminal API and acquired in the receive path 202 at the far-end input terminal NI. Signal power is compared to noise in a test signal to noise ratio operation 816. The signal power is a power estimate of the signal subsequent to a summing node, for example, ec_error_pow in the transmit path 204 or nc_error_pow in the receive path 202. The noise is a noise estimate based on a power estimate of the signal subsequent to the summing node, for example, ne_noise in the transmit path 204 or fe_noise in the receive path 202. If the signal power is greater than or equal to the noise, the operation for computing slow noise 812 terminates 824. Otherwise the signal power is less than the noise so the noise parameter is reduced by setting the noise equal to the signal power in a reset minimum noise level operation 818.

Following the reset minimum noise level operation 818, the noise is compared to a slow noise parameter in a test slow noise operation 820. The slow noise is an estimate derived from a noise estimate that is based on the power estimate of the signal subsequent to a summing node. In the illustrative embodiment, the slow noise is slow_fe_noise in the receive path 202 or slow ne_noise in the transmit path 204. If the noise is less than or equal to the slow noise, then the operation for computing slow noise 812 terminates 824. Otherwise, the noise is greater than the slow noise so that the slow noise is incremented in an increment slow noise operation 822 which increments the slow noise to asymptotically approach the noise parameter. Once the slow noise is incremented, the operation for computing slow noise 812 terminates 824.

Referring to FIG. 8C, a flowchart illustrates a dual mode transmit suppressor operation 830. The dual mode transmit suppressor operation 830 operates on signals in the transmit path 204 following automatic gain correction and begins 832 by first testing error codes against a selected bias value in a test bias operation 834. In the test bias operation 834, a ratio (peak_ec_error_code/ec_error_code) is compared to the transmission suppression bias (TSBias) that is selected in bits 5-4 of MCR3. A suitable TSBias is 18 dB. The test bias operation 834 controls the facility with which a near-end speaker disengages transmit suppression and maintains disengagement of transmit suppression. If the ratio (peak_ec_error_code/ec_error_code) is greater than the TSBias, then the peak ec_error_code is set to the current value of the ec_error_code in a reset peak error code operation 836. Otherwise the ratio (peak_ec_error_code/ec_error_code) is less than or equal to the TSBias and the reset peak error code operation 836 is bypassed. The dual mode transmit suppressor operation 830 then executes a reset transmit suppressor operation 838 in which the transmit suppressor attenuation is set to 0 dB. A test mode operation 840 determines whether the transmit suppressor is operating in default_off mode or default_on mode. If the transmit suppression mode is default_off, then the dual mode transmit suppressor operation 830 skips to a begin double-talk analysis operation 854. Otherwise the transmit suppression mode is default_on and a suppression timer is decremented by one count in a decrement suppression timer operation 842 and the suppression timer is tested for time-out 844.

If the suppression timer is decremented to a time count greater than or equal to zero, then the dual mode transmit suppressor operation 830 skips to the begin double-talk analysis operation 854. Otherwise, the suppressor timer is decremented to less than zero and times out, thereby activating a set attenuation in an Idle state operation 846. The set attenuation in an Idle state operation 846 sets the attenuation to value of the transmit suppression attenuation control, TSAtt, which is preselected in bits 15-14 of MCR3. TSAtt limits the suppression in the transmit channel to a suitable level, illustratively in a range from −12 dB to −24 dB with −24 dB the typical setting. The set attenuation in an Idle state operation 846 also provisionally sets a control flag designating that the transmit path 204 is in an Idle state.

Following the set attenuation in an Idle state operation 846, the dual mode transmit suppressor operation 830 tests to determine whether the transmit path 204 is actually idle in a test for idle transmit path operation 848. The test for idle transmit path operation 848 compares the ec_error_code to the transmit half-duplex detection threshold (THDet) is previously selected in bits 15-14 of MCR1. A suitable transmit half-duplex detection threshold (THDet) is 6 dB. Speech is occurring in the transmit path 204 if the transmit channel signal power is THDet above the noise floor for the transmit channel, in which case the dual mode transmit suppressor operation 830 transitions to an initialize timer operation 852. Otherwise, speech is not occurring in the transmit path 204 and the dual mode transmit suppressor operation 830 terminates 850 with the attenuation set to TSAtt and the transmit state set to Idle.

The initialize timer operation 852 initializes the timer to a TIMER_INIT value that designates a suitable interval for testing whether the speech is present or not present in the transmit channel. One example of a suitable TIMER_INIT value corresponds to a time of 250 ms. The dual mode transmit suppressor operation 830 then transitions to the begin double-talk analysis operation 854.

The begin double-talk analysis operation 854 provisionally sets the state of the transmit suppressor to Off and transitions to a double talk test operation 856. The double talk test operation 856 determines whether both far-end speech and near-end speech are occurring simultaneously. If so, a set double talk attenuation operation 858 sets the transmit suppression attenuation to DBL_TLK_ATTEN, a suitable attenuation for the double talk condition. A suitable DBL_TLK_ATTEN value is −6 dB. Otherwise, double talk is not occurring and the attenuation is not changed.

A peak to peak signal to noise thresholding operation 860 compares a peak to peak SNR code ne_pp_code to a transmit suppression threshold, TSThd, that is preselected in bits 7-6 of MCR3. TSThd sets the ERLE expectation that is used to discriminate between near-end speech and far-end echo and predominately determines the behavior of transmit suppression. The ne pp_code is equal to the peak_ne_in_code divided by the peak_ec_error_code. Suitable values for TSThd range from 9 dB to 18 dB.

The peak to peak SNR codes including ne_pp_code for the near-end and fe_pp_code for the far-end are a measure of instantaneous ERLE of the acoustic echo canceller and the network echo canceller, respectively. The ne_pp_code and the fe_pp_code are used to determine the behavior of the suppressors.

If the transmit suppression threshold TSThd is greater than ne_pp_code, then the dual mode transmit suppressor operation 830 terminates 850 with the transmit suppressor state set to Off and the attenuation set previously or set to DBL_TLK_ATTEN if double talk is present. Otherwise, the TSThd is less than or equal to ne_pp_code and a signal to noise thresholding operation 862 compares a SNR code ne_cc_code to an additional transmit suppression threshold, THLD2. The SNR code ne_cc_code is equal to the ne_in_code divided by the ec_error_code. A suitable value for THLD2 is about 1 dB.

If the additional transmit suppression threshold THLD2 is greater than ne_cc_code, then the dual mode transmit suppressor operation 830 terminates 850 with the transmit suppressor state set to Off and the attenuation set previously or set to DBL_TLK_ATTEN if double talk is present. Otherwise, the THLD 2 is less than or equal to ne_cc_code and a reset transmit attenuation parameters operation 864 sets the attenuation to the transmit suppression attenuation TSAtt, the transmit suppressor state is set to On and the timer initialized to 0. The dual mode transmit suppressor operation 830 then terminates 850.

Referring to FIG. 8D, a flowchart illustrates a receive suppressor operation 870. The receive suppressor operates only in the default_on mode so that the receive suppressor disengages when far-end speech or double-talk occur. The receive suppressor operation 870 operates on signals in the receive path 202 following automatic gain correction and begins 872 by performing three levels of thresholding 874, 876, and 880.

In a signal to slow noise thresholding operation 874, the nc_error_code is compared with the receive suppression threshold RSThd. The nc_error_code is equal to nc_error_pow, the power estimate of the receive signal following the NEC summing node 130, divided by the slow_fe_noise, a noise estimate derived from the fe_noise which is a further noise estimate based on nc_error_pow. The receive suppression threshold RSThd is selected by setting bits 13-12 in MCR2 and sets the threshold of receive path speech detection.

If RSThd is greater than nc_error_code, then the receive suppressor operation 870 passes to an initialize receive attenuation operation 884. Otherwise, RSThd is less than or equal to nc_error_code and a peak to peak signal to noise thresholding operation 876 compares a peak to peak SNR code fe_pp_code to a secondary receive suppression threshold, THLD2. A suitable value for the secondary receive suppression threshold THLD2 is 12 dB. The fe_pp_code is equal to the peak_fe_in_code divided by the peak_nc_error_code.

If the secondary receive suppression threshold THLD2 is less than fe_pp_code, then the receive suppressor operation 870 passes to an initialize receive attenuation operation 884. Otherwise, THLD2 is greater than or equal to fe_pp_code and a test channel ownership operation 878 determines whether the receive path 202 is active so that a far-end speaker has the channel. If the far-end speaker has the channel, then the receive suppressor operation 870 passes to an initialize timer operation 882. Otherwise, the far-end speaker does not have the channel and the receive suppressor operation 870 passes to the third thresholding operation, a peak to peak signal to noise thresholding operation 880.

The cross-channel peak-to-peak signal to noise thresholding operation 880 compares the near-end peak to peak SNR code ne_pp_code to a tertiary receive suppression threshold TBLD 3. A suitable value for THLD3 is 6 dB.

If the ne pp_code is greater than the tertiary receive suppression threshold TBLD3, then the receive suppressor operation 870 passes to the initialize timer operation 882. Otherwise, THLD3 is greater than or equal to ne_pp_code and the receive suppressor operation 870 passes to the initialize receive attenuation operation 884.

The initialize timer operation 882 initializes the timer to a TIMER_INIT value that designates a suitable interval for testing whether the speech is present or not present in the receive channel. One example of a suitable TIMER_INIT value corresponds to a time of 250 ms. The receive suppressor operation 870 then transitions to the initialize receive attenuation operation 884.

The initialize receive attenuation operation 884 sets the attenuation to value of the receive suppression attenuation control, RSAtt. RSAtt limits the suppression in the transmit channel to a suitable level, illustratively in a range from −12 dB to −24 dB with a typical setting of −24 dB. The initialize receive attenuation operation 884 also decrements a receive suppression timer by one count. The receive suppressor operation 870 then passes to a test receive suppression timer for time-out operation 886. If the receive suppression timer is decremented to a time count less than zero and times out, then the receive suppressor operation 870 terminates 894. Otherwise, the receive suppressor timer is decremented to greater than or equal to zero, and the receive suppressor operation 870 passes to a reset receive suppressor operation 888 in which the suppressor attenuation is set to 0 dB.

A double talk test operation 890 then determines whether both far-end speech and near-end speech are occurring simultaneously. If so, a set double talk attenuation operation 892 sets the receive suppression attenuation to DBL_TLK_ATTEN, a suitable attenuation for the double talk condition, and the receive suppressor operation 870 terminates 894. A suitable DBL_TLK_ATTEN value is −6 dB. Otherwise, double talk is not occurring and the attenuation is not changed terminating 894 the receive suppressor operation 870.

Upon completion of the dual mode transmit suppressor operation 830 and the receive suppressor operation 870, transmit and receive attenuation target values are set. The attenuation target values are not immediately forced into operation but instead are gradually introduced using a filtering technique based on the behavior of a single pole infinite impulse response (IIR) filter. IIR filters are well-known in the signal processing arts. Any suitable IIR filter may be employed for determining attenuation values.

Using the filtering operation, the actual attenuation is introduced to smoothly approach the target attenuation from a current attenuation level. In the illustrative embodiment, a following equation describes the introduction of a new attenuation value:

$$\text{new\_attenuation} = \alpha * \text{current\_attenuation} + (1-\alpha) * \text{target\_attenuation}.$$

The coefficient a is selected to attain a desired speed at which the new attenuation is implemented.

Microcontroller Interface

The microcontroller interface 112 supports three input pins including a DATA pin, a STROBE pin, and a DRDY pin. The three input pins interface to output terminals of a microcontroller, thereby allowing write-only access to the 16-bit Microcontroller Control Register (MCR) (not shown). Signals applied to a reset RST pin affect operations of the entire full-duplex speakerphone integrated circuit 100 and are applied to the microcontroller interface 112 to place the full-duplex speakerphone integrated circuit 100 in a known state of operation.

The microcontroller interface 112 is implemented by a serial shift register gated by the DRDY signal. A microcontroller begins a transaction by setting the DRDY signal low and the STROBE signal low. The most significant bit (MSB), Bit 15, of a 16-bit data word is presented to the DATA pin and the STROBE signal is transitioned high to shift the data bit into the full-duplex speakerphone integrated circuit 100. The STROBE signal is transitioned low and readied to shift the next bit into the shift register. The next data bit is presented to the DATA pin, ready to be latched by the rising edge of the STROBE signal. The procedure repeats for the sixteen bits. After the last bit is transferred, the DRDY signal is transitioned high to indicate the conclusion of the transfer and four extra STROBE pulses are applied to latch the data into the full-duplex speakerphone integrated circuit 100.

Figures 9, 10A:
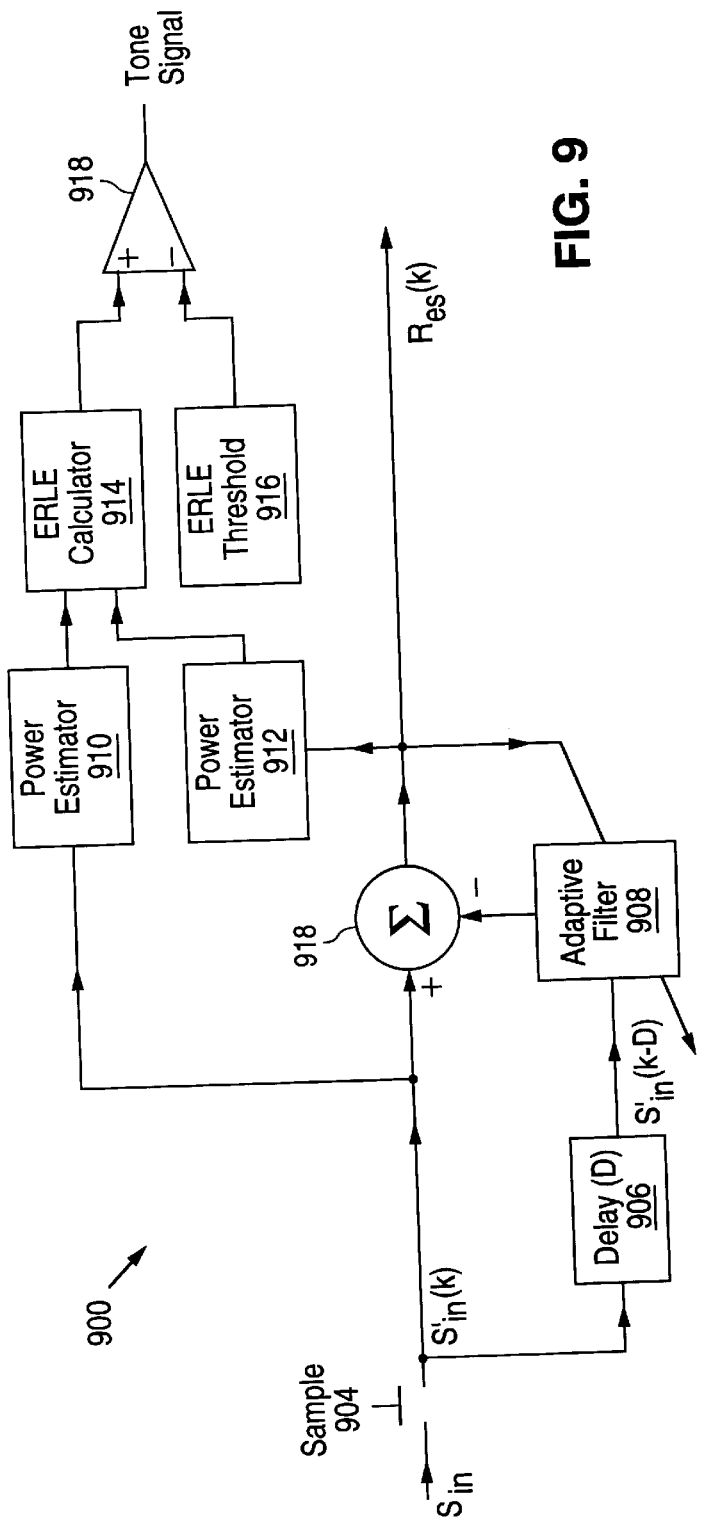

Referring to FIG. 9, a schematic block diagram illustrates a tone detector 900 that is suitable for usage in the full-duplex speakerphone integrated circuit 100. The tone detector 900 operates under a premise that signal and a delayed version of the signal that are significantly correlated define a tone. The measure of correlation for the illustrative tone detector 900 is the performance of an adaptive filter 908 in predicting an error signal.

A continuous signal Sin is input to the tone detector 900 and sampled at a switch 904 to form a digital sampled signal $S'_{in}(k)$. The digital sampled signal $S'_{in}(k)$ is delayed by a delay element 906 to form a delayed signal $S'_{in}(k-D)$ that is applied to an input terminal of the adaptive filter 908. The adaptive filter 908 predicts an error signal for the delayed signal $S_{in}(k-D)$ based on feedback from a result predicted-error-corrected sample signal $R_{es}(k)$. At a summer 918, the digital sampled signal $S'_{in}(k)$ is "corrected" using the predicted error signal from the adaptive filter 908. The measure of correlation is determined by determining a power estimate of the digital sampled signal $S'_{in}(k)$ and a power estimate of the sample signal $R_{es}(k)$ using a power estimator 910 and a power estimator 912, respectively.

An ERLE calculator 914 determines a measure of correlation that tests the performance of the adaptive filter 908 in predicting an error signal from the digital sampled signal $S'_{in}(k)$. The ERLE calculator 914 determines a ratio of the power of the digital sampled signal $S'_{in}(k)$ to the sample signal $R_{es}(k)$ that indicates a measure of error prediction performance specifying the amount of attenuation of an error signal that the adaptive filter 908 supplies.

An ERLE value produced by the ERLE calculator 914 is compared to a preselected threshold value in an ERLE threshold register 916 by a comparator 918 to produce a tone signal. The tone signal is used for subsequent control operations by the full-duplex speakerphone integrated circuit 100.

In an illustrative embodiment, the tone detector 900 is implemented in a software or firmware program that is executed by a processor such as a digital signal processor. In other embodiments, the tone detector 900 may be suitably implemented in various circuit structures.

In an illustrative embodiment, the adaptive filter 908 for the tone detector 900 is implemented as a four-tap Normalized Least-Mean-Square (NLMS) filter which is decimated to a single tap updated every sample. The four-tap implementation of the adaptive filter 908 advantageously performs suitable error prediction for detecting tone signals without consuming significant resources, including circuits, memory, and computation burden. In other embodiments, a wide variety of suitable adaptive filter structures may be used that are known in the art.

In an illustrative embodiment, multiple different ERLE threshold values are selected for usage in the ERLE threshold register 916. For example, one suitable ERLE threshold tests for a weak tone that endures for a relatively long selected duration, and a second suitable ERLE threshold tests for a strong tone that lasts a relatively short duration.

The illustrative tone detector 900 includes the adaptive filter 908 in the form of an adaptive NLMS filter that is similar to the adaptive NLMS filter within the echo canceller. The adaptive NLMS filter within the echo canceller inherently operates as a "tone detector" in a manner similar to the operation of the adaptive filter 908. Tones, being much more correlated signals than speech signals and echo, are therefore disruptive to the operation of the echo canceller, causing corruption of filter coefficients and instability in filter response. The tone detector 900 is advantageously employed to detect tones and block updating of filter coefficients in the echo canceller adaptive filter to prevent disruption caused by tones.

The tone detector 900 is further advantageous on the basis that the NLMS filters within the echo cancellers perform differently depending on whether the system is operating in full-duplex mode or half-duplex mode. In the full-duplex mode, updating of the filter coefficients in the echo canceller is blocked when a tone is detected. In the half-duplex mode, the filter coefficients in the echo canceller are cleared when a tone is detected.

The tone detector 900 advantageously discriminates between noise and a tone. Discrimination between noise and tones is advantageous in a system, such as the full-duplex speakerphone integrated circuit 100, that detects speech signals based on the results of power and noise estimators. A constant power signal, which is a superset of signals defined as tones, are identified as noise, and therefore not detected and not passed through the communication paths. The detection of tones, despite having constant power indicative of noise, allows communication control so that the tones are allowed to pass.

Referring to FIGS. 10A–10 G, seven tables illustrate six control registers Microcontroller Control Register (MCR) 0, 1, 2, 3, 4, and 5 that are accessed via the microcontroller interface 112. The six control registers MCR0, MCR1, MCR2, MCR3, MCR4, and MCR5 are accessed via an external connection to the microcontroller interface 112 and manipulated, for example using software executing on a personal computer running Windows.

The six control registers are addressed by bits b3, b2 and b1 of the MCR Bit b0 is always set to 0. The table depicted in FIG. 10A shows relative bit positions of the six registers. The table shown in FIGS. 10B, 10C, 10D, 10E, 10F, and 10G respectively show registers MCR0, MCR1, MCR2, MCR3, MCR4, and MCR5 in more detail. The Register Map at the top of each register description shows the names of the bits with reset values below the bitfield name. The reset value is also included in a "Word" column of the bit-field summary and indicated by an asterisk '*'.

Referring to FIG. 10B, a table illustrates the name, function, and operation of bits in register MCR0. Bit 15 (Mic) is controlled to enable and disable the microphone analog pre-amplifier 154 shown in FIG. 1. The microphone analog pre-amplifier 154 is enabled by default and disabled by setting the Mic bit to 0.

Bit 14 (HDD) is a Half-Duplex Disable bit, which is controlled to disable and enable half-duplex operation. In normal operation, the full-duplex speakerphone integrated circuit 100 operates in half-duplex mode if the echo canceller does not supply sufficient loop gain reduction to prevent howling. The default condition of the half-duplex mode is the enabled condition so that, for example, the half-duplex mode is active at power-up, before the adaptive filter has adapted. Half-duplex mode prevents howling and masks the convergence of the adaptive filter to model the echo path. In some cases, such as during a measurement of convergence speed at which the adaptive filter models the echo path, the half-duplex mode is undesirable.

Bits 13-12 (GB) control a room-size adjustment technique called "graded beta". Graded beta is supported in the acoustic echo canceller 152 shown in FIG. 1, but not supported in the network echo canceller 128. Graded beta is an architectural enhancement to the full-duplex speakerphone integrated circuit 100 and exploits the tendency of acoustic echoes to decay exponentially with time.

The full-duplex speakerphone integrated circuit 100 advantageously increases convergence speed while maintaining stability by increasing the beta, or updating the gain, for the coefficients of the adaptive filter that occur earlier in time, and decreasing the beta for coefficients that occur later in time. Convergence speed is a measure of how quickly an adaptive filter models the echo path. To improve convergence speed while maintaining stability, an implicit assumption is that the decay rate of an echo is known. Graded beta control allows a system designer to adjust the decay rate. Acoustically live rooms advantageously use either no decay (00–0 dB/ms) or slight decay (11–0.19 dB/ms). Automobile interiors and other acoustically dead spaces benefit from a rapid decay (01–0.75 dB/ms or 10–0.38 dB/ms).

A fast convergence speed is advantageous in many circumstances. For example, if background noise suddenly attenuates, residual echo that was previously masked by the noise leaks through, making echo clearly perceptible from the perspective of the far-end listener until the echo canceller reconverges to accommodate the new noise floor.

A high quality echo canceller continually modifies an internal model of the echo path characteristics. When the model is complete, the echo canceller cancels echoes to the extent of rated cancellation capabilities. Convergence time is the duration for the echo canceller to train from cleared coefficients and switch to full-duplex operation in the presence of speech. Convergence speed is measured by clearing the coefficients of an echo canceller, injecting a training signal into the echo canceller, and measuring the time duration for the ERLE to reach a threshold level. The time duration corresponds to the convergence time.

Bits 11-8 (RVol) control the volume setting in the receive path using peak-limiting via the receiver AGC 138 and digital attenuation at the near-end acoustic output signal DAC 144. When the reference level is set to +0 dB, the receiver AGC 138 is effectively disabled. Volume control is implemented by digital attenuation in 3 dB steps from the reference +0 dB level to lower attenuation levels. The RVol control sets the gain from a maximum gain of +30 dB to a minimum gain of –12 dB in 3 dB steps with a default setting for the receive reference level being +18 dB. The lowest gain setting (1111) mutes the receive path.

Bit 7 (TSD) is controlled to disable and enable a transmit supplementary echo suppression function, a non-linear echo control technique. The attenuation TSAtt is defined in register 3, illustrated in FIG. 10E. The transmit suppression function is enabled in a default state.

Bits 6-5 (ACC) are set to control coefficients in the acoustic echo canceller 152 adaptive filters of the full-duplex speakerphone integrated circuit 100. The ACC is set to a default position (00) for normal operation, in which coefficients self-adjust to the echo path to cancel echo. The ACC is set to a clear position (01) to hold the adaptive filter coefficients to 0, effectively disabling the echo canceller. Unless the half-duplex mode is disabled, the clear position (01) of the ACC forces the full-duplex speakerphone integrated circuit 100 into half-duplex mode. The ACC is set to a freeze position (10) to cause the adaptive filter coefficients to hold current values.

Bit 4 (TSMde) is a Transmit Suppression Mode bit that is used to select the default state of the transmit suppressor. If TSMde is equal to 1, the suppressor operates in a default_off mode. If TSMde is 0, the mode is default_on. Since the default_on state attenuates noise at idle signal levels), default_on is also referred to as a "noise guard". The reset state is TSMde equal to 0.

Referring to FIG. 10C, a table illustrates the name, function, and operation of bits in register MCRI. Bits 15-14 (THDet) set a transmit half-duplex detection threshold. A speech detector (not shown) controls channel switching and channel ownership between the receive and transmit channels in the half-duplex mode. The transmit speech detector registers that speech is occurring if the transmit channel signal power is THDet above the noise floor for the transmit channel.

Bits 13-12 (Taps) control acoustic echo canceller 152 and network echo canceller 128 tap allocation. The full-duplex speakerphone integrated circuit 100 has a total of 63.5 ms of echo canceller taps that are partitioned for usage by the network and acoustic echo cancellers. By default, the full-duplex speakerphone integrated circuit 100 allocates 39.5 ms for the acoustic echo canceller 152 and 24 ms for the network echo canceller 128.

Bits 11-8 (TVol) control the volume setting in the transmit path using peak-limiting via the transmitter AGC 162 and digital attenuation at the far-end network output signal DAC 146. The transmitter AGC 162 is disabled when the reference level is set to +0 dB. Volume control is implemented by digital attenuation in 3 dB steps from the reference +0 dB level to lower attenuation levels. The TVol control sets the gain from a maximum gain of +30 dB to a minimum gain of −12 dB in 3 dB steps with a default setting for the receive reference level being 0 dB. The lowest gain setting (111) mutes the transmit path. An advantage of volume control is that dynamic range compression is transparently achieved.

Bit 7 (RSD) disables and enables the receive suppressor 140. The Receive Supplementary Echo Suppression function is a non-linear echo control process that attenuates signals in the receive path by 24 dB when far-end speech at the far-end input terminal NI is not occurring. Attenuation is released only when the receive channel is active. The Receive Supplementary Echo Suppression function is designed to not be triggered by network echo. By default, the receive suppression function is enabled.

Bits 6-5 (NCC) control adaptive filter coefficients of the network echo canceller 128. The NCC is set to a default position (00) for normal operation, in which coefficients self-adjust to the echo path to cancel echo. The NCC is set to a clear position (01) to hold the adaptive filter coefficients to 0, effectively disabling the echo canceller. Unless the half-duplex mode is disabled, the clear position (01) of the NCC forces the full-duplex speakerphone integrated circuit 100 into half-duplex mode. The NCC is set to a freeze position (10) to cause the adaptive filter coefficients to hold current values.

Bit 4 (AuNECD) is a disable bit for the Network echo path detector. AuNECD allows the Network Echo Canceller (NEC) to be re-enabled when a path is established after the system enters the full duplex mode upon previously disabling the NEC in the absence of a detectable echo path. Automatic disabling of the NEC in the absence of a path is enabled by choosing a non-zero setting for NFNse in register MCR4. Setting the AuNECD bit to 1 disables the NEC detector. After the NEC detector is disabled, if a path is established after entering full duplex operation in the absence of a path, echo from the network path persists until cycling of the NEC coefficients takes place through clearing of the NEC adaptive filter coefficients and subsequently setting the NEC coefficients to normal values. When AuNEC is set to 0, a default condition, the path detector is enabled. When AuNEC is set to 1, the path detector is disabled.

Referring to FIG. 10D, a table illustrates the name, function, and operation of bits in register MCR2. Bits 15-14 (RHDet) set a receive half-duplex detection threshold. A speech detector (not shown) controls channel switching and channel ownership between the receive and transmit channels in the half-duplex mode. The receive speech detector registers that speech is occurring if the receive channel signal power is RHDet above the noise floor for the receive channel.

Bits 13-12 (RSThd) set a receive suppression threshold. RSThd sets a far-end speech detection threshold for disengaging receive suppression. The speech detector that disengages the receive suppression has a sensitivity controlled by RSThd. The suppression is inserted into the receive path unless the far-end signal exceeds the receive channel noise power by RSThd, in which case speech is assumed to be detected and suppression is defeated until speech is no longer detected. RSThd is decreased to increase sensitivity of the speech detector, possibly resulting in false detections due to spurious noise events and causing unpleasant noise modulation at the near-end. RSThd is increased to improve robustness to spurious noise, possibly avoiding detection of speech of weak far-end talkers. RSThd does not affect the ability of the receive suppressor 140 to attenuate residual network echoes.

Bits 11-10 (NseRmp) set a background noise power estimator ramp rate. Background noise power estimators increase the estimate at a rate of NseRmp until the background noise power estimate is equal to the current input power estimate. The background noise power estimators quickly track a reduction in the current input power estimate. Small values of NseRmp are advantageously selected if the environment is expected to have rapidly varying noise levels. Large values of NseRmp are selected if the environment is expected to have a relatively constant noise power.

Bits 9-8 (HDly) set a half-duplex holdover delay. After a channel goes idle in the half-duplex mode of operation, a change of channel ownership is inhibited for a delay of HDly to prevent false switching due to the presence of echoes. Half-duplex operation is more immune to false switching if HDly is longer, but at the cost of preventing a fast response to legitimate channel changes.

Bit 7 (HHold) is a "Hold in half-duplex on Howl" bit, a control flag which, if enabled, holds the system in half-duplex operation howl begins for any reason and the howl detectors trip and clear coefficients. The full-duplex speakerphone integrated circuit 100 transitions to full-duplex operation if HHold is subsequently cleared.

Bit 6 (TDSRmp) is a Transmit Double Talk Suppression Disengage Ramp rate bit that controls the rate that attenuation returns to 0 dB upon cessation of double talk. The attenuation is introduced by the transmit suppressor during double talk (TDbtS). TDSRmp sets transmit double-talk suppression ramp rate to either a slow ramp rate (0), the default condition, or a normal ramp rate (1). In the slow setting, the ramp time is about 1 second. In the normal setting, the ramp time is on the order of tens of milliseconds.

Bit 5 (RDSRmp) is a Receive Double Talk Suppression Disengage Ramp rate bit that controls the rate attenuation returns to 0 dB upon cessation of double talk. The attenuation is introduced by the receive suppressor during double talk (RDbtS). RDSRmp sets receive double-talk suppression ramp rate to either a slow ramp rate (0), the default condition, or a normal ramp rate (1).

Bit 4 (IdlTx) is an idle state control bit that controls the idle state of the half duplex controller. The half duplex controller determines which channel is to be active for operations when the system state is half duplex. For example, a half-duplex state prevails when the adaptive filters are not yet trained. If the IdlTx bit is equal to 0, the half duplex controller idles in the last active channel. Idle refers to the state when no speech is present in either channel. If the IdlTx bit is equal to 1, the idle state always has the transmit channel active. The IdlTx bit, when enabled with the noise guard disabled (TSMde=1, default_off), results in a faux full duplex effect to the far-end user (on a handset) while the system is training. The user at the far-end hears the near-end almost as soon as far-end speech ceases and perceives half-duplex operation only when attempting to double talk. The IdlTx feature becomes moot when the noise guard is enabled. The IdlTx feature is expected to be enabled when the noise guard is disabled and vice-versa.

Referring to FIG. 10E, a table illustrates the name, function, and operation of bits in register MCR3. Bits 15-14 (TSAtt) set the transmit suppression attenuation, the amount of suppression attenuation inserted into the transmit path when transmit suppression is engaged.

Bit 13 (PCSen) controls path change sensitivity. The acoustic interface 122 typically has many path changes, for example, as people move about in the room containing an operating full-duplex speakerphone. The PCSen bit determines the sensitivity of the path change detector. PCSen is set to 0 for high sensitivity and 1 for low sensitivity. If PCSen is set to high sensitivity, extended double-talk may cause the full-duplex speakerphone integrated circuit 100 to briefly enter half-duplex mode. When PCSen is set to low sensitivity, a brief echo may be heard during path changes.

Bits 12-10 (TDbtS) are Transmit Double Talk Suppression Attenuation bits for setting the attenuation of the transmit suppressor when the operating state is determined to be the double-talk state in which both channels are simultaneously active. The TDbtS is only possible in full duplex. The default TDbtS value is 000 and produces no attenuation. TDbtS values increase from 001 to 111 to generate at 3 dB increments, resulting in attenuation levels from −3 dB to −21 dB, respectively.

Bits 9-8 (RDbtS) are Receive Double Talk Suppression Attenuation bits for setting the attenuation of the receive suppressor when the operating state is determined to be the double-talk state in which both channels are simultaneously active. The RDbtS is only possible in full duplex. The default RDbtS value is 00 and produces no attenuation. RDbtS values increase from 01 to 11 to generate at 3 dB increments, resulting in attenuation levels from −3 dB to −9 dB, respectively.

Bits 7-6 (TSThd) set a transmit suppression threshold. TSThd sets an ERLE threshold for discriminating between echo and near-end speech by a supplementary echo suppressor (not shown).

Bits 5-4 (TSBias) set the transmit suppression bias level, which affects the ease with which near-end speech interrupts or is interrupted by far-end speech.

Referring to FIG. 10F, a table illustrates the name, function, and operation of bits in register MCR4. Bits 15-14 (AErle) set the acoustic Echo Return-Loss Enhancement (ERLE) threshold. The full-duplex speakerphone integrated circuit 100 allows full-duplex operation only when the Acoustic ERLE exceeds the threshold set by the AErle setting.

Bits 13-12 (AFNse) set the acoustic full-duplex noise threshold. The AFNse operates in combination with the AErle to determine when the full-duplex speakerphone integrated circuit 100 is to transition into full-duplex operation. If the current noise level at the near-end input terminal API is greater than AFNse, then AErle is used to determine whether full-duplex operation is allowed. If the noise level is below the level of AFNse, the full-duplex speakerphone integrated circuit 100 uses an internal estimate of asymptotic performance to determine whether to transition to full-duplex operation. If the AFNse value is zero, then AErle is always the full-duplex criterion. Other AFNse values are used for cases not having an acoustic path for the adaptive filter to model.

Bits 11-10 (NErle) set the network Echo Return-Loss Enhancement (ERLE) threshold. The full-duplex speakerphone integrated circuit 100 allows full-duplex operation only when the Network ERLE exceeds the threshold set by the NErle setting.

Bits 9-8 (NFNse) set the network full-duplex noise threshold. The NFNse operates in combination with the NErle to determine when the full-duplex speakerphone integrated circuit 100 is to transition into full-duplex operation. If the current noise level at the far-end input terminal NI is greater than NFNse, then NErle is used to determine whether full-duplex operation is allowed. If the noise level is below the level of NFNse, the full-duplex speakerphone integrated circuit 100 uses an internal estimate of asymptotic performance to determine whether to transition to full-duplex operation. If the NFNse value is zero, then NErle is always the full-duplex criterion. Other NFNse values are used for cases not having a network path for the adaptive filter to model, or cases for which the existence of a network path is not determine prior to placing a call.

Bits 7-6 (RGain) is a receive analog gain select that controls the amount of additional on-chip analog gain that is supplied to the network input of the full-duplex speakerphone integrated circuit 100. RGain sets the gain of the network interface programmable analog gain stage amplifier 172 prior to the network input ADC 134. The default RGain in the network transmit path is 0 dB of gain. A change in the RGain setting changes the fullscale voltage that may be applied to the far-end input terminal NI before clipping occurs at the network input ADC 134.

Bits 5-4 (TGain) is a transmit analog gain select that controls the amount of additional on-chip analog gain that is supplied to the acoustic input of the full-duplex speakerphone integrated circuit 100. TGain sets the gain of the acoustic interface programmable analog gain stage amplifier 156 prior to the acoustic input ADC 136. In both the transmit and receive signal path, a programmable gain amplifier (PGA) is inserted before each ADC and adds 0 dB, 6 dB, 9.5 dB, or 12 dB of gain to the signal path. The default TGain in the acoustic, transmit path is 0 dB of gain. A change in the TGain setting changes the fullscale voltage that may be applied to the near-end input terminal API before clipping occurs at the acoustic ADC 136.

Referring to FIG. 10G, a table illustrates the name, function, and operation of bits in register MCR 5. Bit 15 (HwID) is a howling detector enable/disable bit that disables the instability ("howling") detector. The default setting of HwID is 0 so that the instability detector is enabled. The full-duplex speakerphone integrated circuit 100 detects instability and responds to an instability detection by transitioning the system into the HDX mode provided the HDX mode is facilitated.

Bit 14 (TD) is a tone detector enable/disable bit for enabling and disabling the tone detector, which detects narrowband signals in the receive signal path. Disabling the tone detector allows the echo cancellers to train on narrow band signals such as sine waves. Any protection afforded the echo cancellers by training on tones as well as by forcing activity of the receive signal path when the half-duplex mode is active is not attained when the tone detector is disabled. TD is set to 0, the default mode setting, to enable the tone detector. TD is set to 1 to disable the tone detector.

Bit 13 (APCD) is an Acoustic Echo Canceller (AEC) path change detection enable/disable bit. Disabling of the AEC path change detection operation allows testing of the AEC double talk detector when the path change detector is no longer able to transition the system into half-duplex mode. APCD is set to 0, the default mode setting, to enable the AEC path change detector. APCD is set to 1 to disable the AEC path change detector.

Bit 12 (NPCD) is a Network Echo Canceller (NEC) path change detection enable/disable bit. Disabling of the NEC path change detection operation allows testing of the NEC double talk detector when the path change detector is no longer able to transition the system into half-duplex mode. NPCD is set to 0, the default mode setting, to enable the NEC path change detector. NPCD is set to 1 to disable the NEC path change detector.

Bit 11 (APFD) is an Acoustic Echo Canceller (AEC) pre-emphasis filter enable/disable bit. A pre-emphasis filter is introduced by default before transmit data is passed to the AEC delay line. APFD is set to 0, the default mode setting, to enable the AEC pre-emphasis filter. APFD is set to 1 to disable the AEC pre-emphasis filter.

Bit 10 (NPFD) is a Network Echo Canceller (NEC) pre-emphasis filter enable/disable bit. A pre-emphasis filter is introduced by default before transmit data is passed to the NEC delay line. NPFD is set to 0, the default mode setting, to enable the NEC pre-emphasis filter. NPFD is set to 1 to disable the NEC pre-emphasis filter.

Bit 9 (AECD) is an Acoustic Echo Canceller enable/disable bit. AECD is set to 0, the default mode setting, to enable the AEC. AECD is set to 1 to disable the AEC so that the AEC is no longer available and does not influence the decision process to transition into full-duplex mode.

Bit 8 (NECD) is a Network Echo Canceller enable/disable bit. NECD is set to 0, the default mode setting, to enable the NEC. NECD is set to 1 to disable the NEC so that the NEC is no longer available and does not influence the decision process to transition into full-duplex mode.

Bits 7-6 (ASdt) are Acoustic side tone bits that are used to add a digital on-chip sidetone to the Audio ADC output generated by attenuation of Audio DAC input. A default setting of 00 adds nothing to the Audio ADC output. Settings from 01 to 11 add sidetones from −24 dB to −12 dB in 6 dB increments.

Bits 5-4 (NSdt) are Network side tone bits that are used to add a digital on-chip sidetone to the Network ADC output generated by attenuation of Network DAC input. A default setting of 00 adds nothing to the Network ADC output. Settings from 01 to 11 add sidetones from −24 dB to −12 dB in 6 dB increments.

The full-duplex speakerphone integrated circuit 100 responds to a hardware reset by calibrating all ADCs and DACs, performing internal digital initialization operations, sampling the Microcontroller Control Register (MCR), then restoring the default values of the MCR.

A cold reset is a total reset of all components of the full-duplex speakerphone integrated circuit 100 including the ADCs and DACs. Echo canceller memories and registers are cleared and default settings of the MCR are restored. A warm reset is similar to a cold reset except that echo canceller coefficients and selected key variables are not cleared but instead keep pre-reset values.

The microcontroller interface 112 is used to control the performance of the echo cancellers. One substantial determinant of performance is the gain structure of the full-duplex speakerphone integrated circuit 100. Gain distribution is an intricate balancing act in which a system integrator attempts to maxime dynamic range, minimize noise, and attain excellent echo canceller performance. A basic constraint for attaining good echo canceller performance is that the maximum output should not clip when coupled to the input terminal. For example, if the near-end output terminal AO of a speakerphone supplies 1 $V_{rms}$ to a speaker, then reflections reaching the microphone should present no more than 1 $V_{rms}$ to the acoustic input ADC 136. In fact, 6 dB or even 12 dB of margin is suitable such that in the example, the signal present at the acoustic input ADC 136 is 250 $mV_{rms}$.

After the coupling level is established, the desired signal gain is established. Continuing the previous example, the transmit gain is adjusted to ensure the near-end speaker is easily heard at the far-end. If the signal from the near-end speaker clips at the acoustic input ADC 136, the effect is not significant to the echo path because the acoustic echo canceller 152 is not updating anyway.

To achieve a general noise reduction, system gain is to be concentrated before the ADC. The full-duplex speakerphone integrated circuit 100 implements automatic gain control via the TVol and RVol controls in the MCR to supply a suitable gain. The full-duplex speakerphone integrated circuit 100 has two different programmable gain sources: TGain/RGain and TVol/RVol. TGain and RGain switch in different size sampling capacitors at the ADC to supply a choice of 0 dB, 6 dB, 9.5 dB, and 12 dB of analog gain. TVol and RVol introduce digital gain and attenuation in 3 dB steps. The difference between gain control (TGain/RGain) and volume control (TVofRVol) is significant in that the digital gain adds gain to the noise of the ADC as well as the desired signal, whereas the analog gain does not.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims. For example, the illustrative dynamic volume control system is controlled by a process executed on a digital signal processor controlled by software. In other embodiments, the early dynamic volume control system may be implemented as a circuit of logic implementation. In other embodiments, the dynamic volume control system may be implemented using a general-purpose computer, a microprocessor, or other computational device.

What is claimed is:

1. A full-duplex communication circuit comprising:

a signal path;

a half-duplex controller coupled to the signal path;

a writable access port;

a controller interface coupled to the access port and coupled to the half-duplex controller, the controller interface including a writable register, the writable register including a half-duplex mode enable/disable field, the half-duplex mode enable/disable field controlling the half-duplex controller to enable and disable half-duplex mode operation.

2. A circuit according to claim 1, further comprising:

a receive signal path;

a receive half-duplex controller coupled to the receive signal path;

a transmit signal path;

a transmit half-duplex controller coupled to the transmit signal path; and an adaptive filter coupled to the transmit signal path and coupled to the receive signal path for accessing a first signal, determining a compensation signal from the first signal, and compensating a second signal using the compensating signal to form a compensated second signal having a loop gain reduction;

wherein the controller interface enables half-duplex mode operation so that the circuit operates in half-duplex mode if the echo canceller does not supply sufficient loop gain reduction to prevent howling, and the controller interface disables half-duplex mode operation to prevent half- duplex mode operation.

3. A circuit according to claim 1, further comprising:

a suppressor coupled to the signal path;

a controller interface coupled to the access port and coupled to the suppressor, the controller interface including a writable register, the writable register including a suppressor threshold field, the suppressor threshold field controlling the suppressor to set a speech detection threshold for disengaging suppression.

4. A circuit according to claim 1, wherein:

the controller interface writable register includes a half-duplex holdover delay field, the half-duplex holdover delay field setting a delay time during which a change of channel ownership is delayed to prevent false switching due to the presence of echoes.

5. A circuit according to claim 1, further comprising:

an instability detector coupled to the half-duplex controller, the instability detector detecting an instability condition and responding to the instability detection by transitioning into the half-duplex mode operation when enabled;

wherein the controller interface writable register includes a howling detector enable/disable field for enabling and disabling the instability detector.

6. A circuit according to claim 1, wherein:

a suppressor coupled to the signal path;

a controller interface coupled to the access port and coupled to the suppressor, the controller interface including a writable register, the writable register including a double talk suppression disengage ramp rate field controlling the suppressor rate at which suppression attenuation returns to 0 dB on cessation of double talk.

7. A circuit according to claim 1, wherein:

a suppressor coupled to the signal path;

a controller interface coupled to the access port and coupled to the suppressor, the controller interface including a writable register, the writable register including a suppressor threshold field, the suppressor threshold field controlling the suppressor to set a speech detection threshold for disengaging suppression; and the writable register further including a double talk suppression disengage ramp rate field controlling the suppressor rate at which suppression attenuation returns to 0 dB on cessation of double talk.

8. A circuit according to claim 1, wherein:

a suppressor coupled to the signal path;

a controller interface coupled to the access port and coupled to the suppressor, the controller interface including a writable register, the writable register including a suppression attenuation field controlling the amount of suppression attenuation inserted into a signal path when suppression is engaged in the signal path.

9. A circuit according to claim 8, wherein:

the suppression attenuation field is a transmit attenuation field controlling the amount of suppression attenuation inserted into the transmit signal path.

10. A circuit according to claim 8, wherein:

the suppression attenuation field is a receive attenuation field controlling the amount of suppression attenuation inserted into the receive signal path.

11. A circuit according to claim 1, wherein:

the writable register includes a transmit half-duplex detection threshold field for selectively setting a threshold for detecting speech so that speech is occurring in the transmit channel when the transmit channel signal power exceeds the transmit channel signal power.

12. A circuit according to claim 1, wherein:

the writable register includes a receive half-duplex detection threshold field for selectively setting a threshold for detecting speech so that speech is occurring in the receive channel when the receive channel signal power exceeds the receive channel signal power.

13. A circuit according to claim 1, wherein:

the writable register includes an idle state control field for selectively determining whether the receive channel or the transmit channel is idle while operating in the half-duplex mode.

14. A fill-duplex communication circuit comprising:
a signal path;
a suppressor coupled to the signal path;
a writable access port;
a controller interface coupled to the access port and coupled to the suppressor, the controller interface including a writable register, the writable register including a suppressor threshold field, the suppressor threshold field controlling the suppressor to set a speech detection threshold for disengaging suppression.

15. A circuit according to claim 14, wherein:
the suppressor threshold field sets a speech detection threshold for disengaging suppression in the signal path, suppression being inserted into the signal path unless a detected input signal to the signal path exceeds a channel noise power by the inserted suppression so that speech is assumed to be detected and suppression is defeated until speech is no longer detected.

16. A circuit according to claim 14, further comprising:
a transmit signal path;
a transmit suppressor coupled to the transmit signal path;
a receive signal path; and
a receive suppressor coupled to the receive signal path;
wherein the controller interface includes a writable register including a transmit suppressor threshold field and a receive suppressor threshold field, the transmit suppressor threshold field and the receive suppressor threshold field controlling the transmit suppressor and the receive suppressor, respectively, to set a speech detection threshold for disengaging suppression.

17. A full-duplex communication circuit comprising:
a signal path;
a suppressor coupled to the signal path;
a writable access port;
a controller interface coupled to the access port and coupled to the suppressor, the controller interface including a writable register, the writable register including a double talk suppression disengage ramp rate field controlling the suppressor rate at which suppression attenuation returns to 0 dB on cessation of double talk.

18. A circuit according to claim 17, wherein:
the writable register includes a suppressor threshold field, the suppressor threshold field controlling the suppressor to set a speech detection threshold for disengaging suppression.

19. A circuit according to claim 18, wherein:
the suppressor threshold field sets a speech detection threshold for disengaging suppression in the signal path, suppression being inserted into the signal path unless a detected input signal to the signal path exceeds a channel noise power by the inserted suppression so that speech is assumed to be detected and suppression is defeated until speech is no longer detected.

20. A circuit according to claim 17, wherein:
the writable register includes fields controlling a transmit suppression parameter in the transmit signal path.

21. A circuit according to claim 17, wherein: the writable register includes fields controlling a receive suppression parameter in the receive signal path.

22. A circuit according to claim 17, wherein:
the writable register includes a supplementary echo suppressor enable/disable field for selectively enabling and disabling echo suppression in the signal path.

23. A circuit according to claim 17, wherein:
the writable register includes a supplementary echo suppressor threshold field for selectively setting an ERLE threshold for discriminating between echo and speech by the suppressor.

24. A circuit according to claim 17, wherein:
the writable register includes a suppression attenuation field controlling the suppression attenuation inserted into the signal path when suppression is engaged.

25. A circuit according to claim 17, wherein:
the writable register includes a suppression bias field for controlling the facility with which a speaker disengages and maintains disengagement of suppression.

26. A circuit according to claim 17, wherein:
the writable register includes a supplementary echo suppressor mode enable/disable field for selectively setting a suppressor mode to a default_on mode and a default_off mode.

27. A circuit according to claim 17, further comprising:
a transmit signal path;
a receive signal path; and
a double talk detector for detecting simultaneous speech in the transmit signal path and the receive signal path;
wherein the writable register includes a double talk suppression disengage ramp rate field for controlling the rate attenuation returns to 0 dB upon cessation of double talk.

28. A circuit according to claim 17, further comprising:
a transmit signal path;
a receive signal path; and
a double talk detector for detecting simultaneous speech in the transmit signal path and the receive signal path;
wherein the writable register includes a double talk suppression attenuation field for controlling attenuation of the suppressor when an operating state is determined to be a double-talk state in which both channels are simultaneously active.

29. A circuit according to claim 17, further comprising:
a transmit signal path;
a receive signal path; and
an echo path absence and presence detector coupled to the transmit signal path and the receive signal path for detecting the absence or presence of an echo path;
wherein the writable register includes an echo path detector disable/enable field.

30. A circuit according to claim 29, further comprising:
a transmit channel echo path absence and presence detector; and
a receive channel echo path absence and presence detector;
wherein the writable register includes a transmit channel echo path detector disable/enable field and a receive channel echo path detector disable/enable field.

31. A full-duplex communication circuit comprising:
a receive signal path;
a receive half-duplex controller coupled to the receive signal path;
a transmit signal path;
a transmit half-duplex controller coupled to the transmit signal path; and
an echo canceller including an adaptive filter coupled to the transmit signal path and coupled to the receive signal path for accessing a first signal, determining a compensation signal from the first signal, and compensating a second signal using the compensating signal to form a compensated second signal having a loop gain reduction;

a writable access port;

a controller interface coupled to the access port and coupled to the half-duplex controller, the controller interface including a writable register having a field for controlling operation of the adaptive filter.

32. A circuit according to claim 31, wherein:
the writable register includes a control adaptive filter coefficients field for controlling adaptive filter coefficients of the echo canceller.

33. A circuit according to claim 31, wherein:
the writable register includes a control adaptive filter coefficients field for controlling adaptive filter coefficients of the echo canceller to adjust an echo path to cancel echo.

34. A circuit according to claim 31, wherein:
the writable register includes a control adaptive filter coefficients field for controlling adaptive filter coefficients of the echo canceller to disable the echo canceller.

35. A circuit according to claim 31, wherein:
the writable register includes a control adaptive filter coefficients field for controlling adaptive filter coefficients of the echo canceller to hold the adaptive filter coefficients to current values, thereby freezing the echo canceller.

36. A circuit according to claim 31, wherein:
the writable register includes a control adaptive filter coefficients field for controlling adaptive filter coefficients of a transmit echo canceller for canceling echoes in the transmit signal path.

37. A circuit according to claim 31, wherein:
the writable register includes a control adaptive filter coefficients field for controlling adaptive filter coefficients of a receive echo canceller for canceling echoes in the receive signal path.

38. A circuit according to claim 31, further comprising:
an acoustic echo canceller for canceling echoes in an acoustic echo path;
a network echo canceller for canceling echoes in a network echo path;
wherein the writable register includes a control adaptive filter coefficients field for selectively allocating a plurality of adaptive filter coefficients between the acoustic echo canceller and the network echo canceller.

39. A circuit according to claim 31, wherein:
the writable register includes a control adaptive filter coefficients field for controlling timing of an exponential decay of acoustic echoes.

40. A circuit according to claim 31, wherein:
the writable register includes a control adaptive filter coefficients field for controlling convergence speed of a decay rate of acoustic echoes.

41. A circuit according to claim 31, wherein:
the writable register includes a control adaptive filter coefficients field for controlling timing of an exponential decay of acoustic echoes so that initial taps in the adaptive filter are large and later taps are small allowing initial taps to adapt faster and later taps to maintain stability.

42. A circuit according to claim 31, wherein:
the writable register includes a control adaptive filter coefficients field for controlling ERLE threshold so that full-duplex operation is allowed only when the current ERLE exceeds the ERLE threshold.

43. A circuit according to claim 31, wherein:
the writable register includes a noise threshold field for setting a noise threshold for detection of existence or nonexistence of an echo path and for determining whether full-duplex operation is allowed.

44. A circuit according to claim 31, further comprising:
a path change detector coupled to the transmit signal path and the receive signal path, wherein:
the writable register includes an ec ho canceller path change enable/disable field for disabling of a path change detection operation to allow testing of a double talk detector when a path change detector is disabled from transitioning into half-duplex mode.

45. A circuit according to claim 31, further comprising:
a path change detector coupled to the transmit signal path and the receive signal path, wherein:
the writable register includes an path change sensitivity selection field for determining sensitivity of the path change detector.

46. A circuit according to claim 31, further comprising:
an analog-to-digital converter (ADC) coupled to a signal path of the transmit signal path and the receive signal path;
a digital-to-analog converter (DAC) coupled to the signal path; and
the writeable register includes a side tone field for adding digital on-chip sidetone to the ADC output signal that is generated by attenuation of the DAC input signal.

47. A circuit according to claim 31, further comprising:
a tone detector coupled to a signal path of the receive signal path and the transmit signal path; and
the writeable register includes a tone detect enable/disable field for selectively enabling and disabling the tone detector.

48. A circuit according to claim 31, further comprising:
a pre-emphasis filter coupled to the echo canceller and coupled to a signal path of the receive signal path and the transmit signal path; and
the writeable register includes a pre-emphasis filter enable/disable field for selectively enabling and disabling the pre-emphasis filter.

49. A full-duplex communication circuit comprising:
a signal path;
a programmable analog gain stage amplifier coupled to the signal path;
a writable access port;
a controller interface coupled to the access port and coupled to the programmable analog gain stage amplifier, the controller interface including a writable register, the writable register including a parameter for controlling the programmable analog gain stage amplifier.

50. A circuit according to claim 49, wherein:
the writable register includes an analog gain select field for controlling the amount of additional on-chip analog gain that is supplied to the acoustic input of the full-duplex speakerphone circuit by the programmable analog gain stage amplifier.

51. A circuit according to claim 49, wherein:
the writable register includes an analog gain enable/disable field for selectively enabling and disabling automatic gain control of the programmable analog gain stage amplifier.

52. A circuit according to claim 49, wherein:

the writable register includes a volume control field for controlling the signal volume in the signal path.

53. A full-duplex communication circuit comprising:

a receive signal path;

a transmit signal path; and an echo canceller including an adaptive filter coupled to the transmit signal path and coupled to the receive signal path for accessing a first signal, determining a compensation signal from the first signal, and compensating a second signal using the compensating signal to form a compensated second signal having a loop gain reduction;

a readable access port;

a controller interface coupled to the readable access port and coupled to the half-duplex controller, the controller interface including a readable register having a field reporting a circuit status.

54. A circuit according to claim 53, further comprising:

a receive half-duplex controller coupled to the receive signal path;

a transmit half-duplex controller coupled to the transmit signal path; and the readable register includes a HDX/FDX status field for reporting whether the circuit is operating in a half-duplex mode or a full-duplex mode.

55. A circuit according to claim 53, further comprising:

a receive half-duplex controller coupled to the receive signal path;

a transmit half-duplex controller coupled to the transmit signal path; and the readable register includes a HDX channel ownership status field for reporting whether the receive signal path or the transmit signal path is active while operating in the half-duplex mode.

56. A circuit according to claim 53, further comprising:

a receive speech detector coupled to the receive signal path;

a transmit speech detector coupled to the transmit signal path; and the readable register includes a receive speech detection and a transmit speech detection status field for reporting whether a speech signal is active on the receive signal path and a speech signal is active on the transmit signal path.

57. A circuit according to claim 53, further comprising:

an ERLE calculator for calculating a current ERLE value;

a comparator for determining a best ERLE value on the basis of a current ERLE values calculated over time; and the readable register includes a best ERLE value field and a current ERLE value field for reporting a best ERLE value and a current ERLE value.

58. A circuit according to claim 53, further comprising:

a power estimator coupled to the receive signal path and the transmit signal path;

a noise estimator coupled to the power estimator for determining a noise estimate; and the readable register includes a noise field for reporting a noise estimate.

59. A circuit according to claim 53, further comprising:

a gain stage amplifier coupled to a signal path of the receive signal path and the transmit signal path, the gain stage amplifier controlled by an automatic gain parameter; and the readable register includes an automatic gain control status field for reporting the automatic gain parameter.

60. A circuit according to claim 53, further comprising:

a receive suppressor coupled to the receive signal path;

a transmit suppressor coupled to the transmit signal path; and the readable register includes a suppressor status field for reporting whether the transmit suppressor and the receive suppressor are engaged.

61. A circuit according to claim 53, further comprising:

an echo canceller including an adaptive filter coupled to the transmit signal path and coupled to the receive signal path for accessing a first signal, determining a compensation signal from the first signal, and compensating a second signal using the compensating signal to form a compensated second signal having a loop gain reduction; and the readable register includes an echo canceller status field for reporting an echo canceller status.

62. A circuit according to claim 53, further comprising:

a tone detector coupled to a signal path of the receive signal path and the transmit signal path; and the readable register includes a tone detect status field for reporting whether a tone is detected in the signal path.

63. A circuit according to claim 53, further comprising:

an analog-to-digital converter (ADC) coupled to a signal path of the receive signal path and the transmit signal path; and the readable register includes an ADC clip detect status field for reporting whether a signal is clipped by the ADC.

* * * * *